US012610573B2

(12) United States Patent (10) Patent No.: US 12,610,573 B2
Nishi et al. (45) Date of Patent: Apr. 21, 2026

(54) SEMICONDUCTOR DEVICE AND METHOD FOR MANUFACTURING SEMICONDUCTOR DEVICE

(71) Applicant: Mitsubishi Electric Corporation, Tokyo (JP)

(72) Inventors: Koichi Nishi, Tokyo (JP); Sho Tanaka, Tokyo (JP); Shinya Soneda, Tokyo (JP); Kazuya Konishi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 488 days.

(21) Appl. No.: 17/387,799

(22) Filed: Jul. 28, 2021

(65) Prior Publication Data

US 2022/0123132 A1 Apr. 21, 2022

(30) Foreign Application Priority Data

Oct. 21, 2020 (JP) ................................ 2020-176862

(51) Int. Cl.
*H10D 12/00* (2025.01)
*H01L 21/265* (2006.01)
(Continued)

(52) U.S. Cl.
CPC ..... *H10D 12/481* (2025.01); *H01L 21/26513* (2013.01); *H01L 21/266* (2013.01);
(Continued)

(58) Field of Classification Search
None
See application file for complete search history.

(56) References Cited

U.S. PATENT DOCUMENTS

| | | | | |
|---|---|---|---|---|
| 6,040,599 A | * | 3/2000 | Takahashi | ......... H01L 29/66348 257/E29.066 |
| 6,781,199 B2 | * | 8/2004 | Takahashi | ......... H01L 29/66348 257/E21.384 |

(Continued)

FOREIGN PATENT DOCUMENTS

| | | |
|---|---|---|
| DE | 11 2012 004 026 T5 | 7/2014 |
| JP | H11-345969 A | 12/1999 |

(Continued)

OTHER PUBLICATIONS

An Office Action issued by the German Patent and Trademark Office on Sep. 8, 2024, which corresponds to German Patent Application No. 102021124500.1 and is related to U.S. Appl. No. 17/387,799; with English language translation.

(Continued)

*Primary Examiner* — Vincent Wall
(74) *Attorney, Agent, or Firm* — Studebaker Brackett PLLC

(57) ABSTRACT

In a mesa region sandwiched between adjacent active trenches among mesa regions that are regions each sandwiched between adjacent trenches, a third semiconductor layer has regions discretely arranged in a first direction so as to be in contact with one active trench of the adjacent active trenches and not in contact with the other active trench, and regions discretely arranged in the first direction so as to be in contact with the other active trench and not in contact with the one active trench. In the mesa region sandwiched between the adjacent active trenches, a fourth semiconductor layer is disposed between the third semiconductor layer on the side in contact with the one active trench and the third semiconductor layer on the side in contact with the other active trench in plan view and between the respective (Continued)

regions of the third semiconductor layer discrete in the first direction.

17 Claims, 20 Drawing Sheets

(51) Int. Cl.

| | | |
|---|---|---|
| *H01L 21/266* | (2006.01) | |
| *H10D 8/00* | (2025.01) | |
| *H10D 12/01* | (2025.01) | |
| *H10D 62/17* | (2025.01) | |
| *H10D 64/00* | (2025.01) | |
| *H10D 84/60* | (2025.01) | |

(52) U.S. Cl.
CPC ........... *H10D 8/422* (2025.01); *H10D 12/038* (2025.01); *H10D 62/393* (2025.01); *H10D 64/112* (2025.01); *H10D 64/117* (2025.01); *H10D 84/617* (2025.01)

(56) References Cited

U.S. PATENT DOCUMENTS

| | | | | |
|---|---|---|---|---|
| 7,154,145 | B2 * | 12/2006 | Takahashi | ............. H01L 29/407 |
| | | | | 257/E21.384 |
| 10,439,061 | B2 | 10/2019 | Nishimura | |
| 2004/0094798 | A1 * | 5/2004 | Hara | .................. H01L 29/0634 |
| | | | | 257/E29.037 |
| 2008/0048295 | A1 * | 2/2008 | Takahashi | ........... H01L 29/7397 |
| | | | | 257/E21.384 |
| 2011/0193132 | A1 * | 8/2011 | Kouno | ................ H01L 29/7391 |
| | | | | 257/E29.197 |
| 2011/0233684 | A1 | 9/2011 | Matsushita | |
| 2012/0146091 | A1 | 6/2012 | Tanabe et al. | |
| 2014/0217464 | A1 | 8/2014 | Higuchi et al. | |
| 2015/0221566 | A1 * | 8/2015 | Ookura | ................... H01L 22/14 |
| | | | | 257/48 |
| 2018/0138299 | A1 | 5/2018 | Naito | |

FOREIGN PATENT DOCUMENTS

| | | | | | |
|---|---|---|---|---|---|
| JP | 2000106434 | A | * | 4/2000 | ......... H01L 29/7813 |
| JP | 2011-204803 | A | | 10/2011 | |
| JP | 4825688 | B2 | | 11/2011 | |
| JP | 2012-138567 | A | | 7/2012 | |
| JP | 2013-084922 | A | | 5/2013 | |
| JP | 2017-147431 | A | | 8/2017 | |
| JP | 2019-016765 | A | | 1/2019 | |
| JP | 6507609 | B2 | | 5/2019 | |

OTHER PUBLICATIONS

An Office Action; "Notice of Reasons for Refusal," mailed by the Japanese Patent Office on Sep. 19, 2023, which corresponds to Japanese Patent Application No. 2020-176862 and is related to U.S. Appl. No. 17/387,799; with English language translation.

Office Action issued in CN 202111204390.0; mailed by the State Intellectual Property Office of the People's Republic of China on Jan. 3, 2025.

* cited by examiner

F I G .   1
100
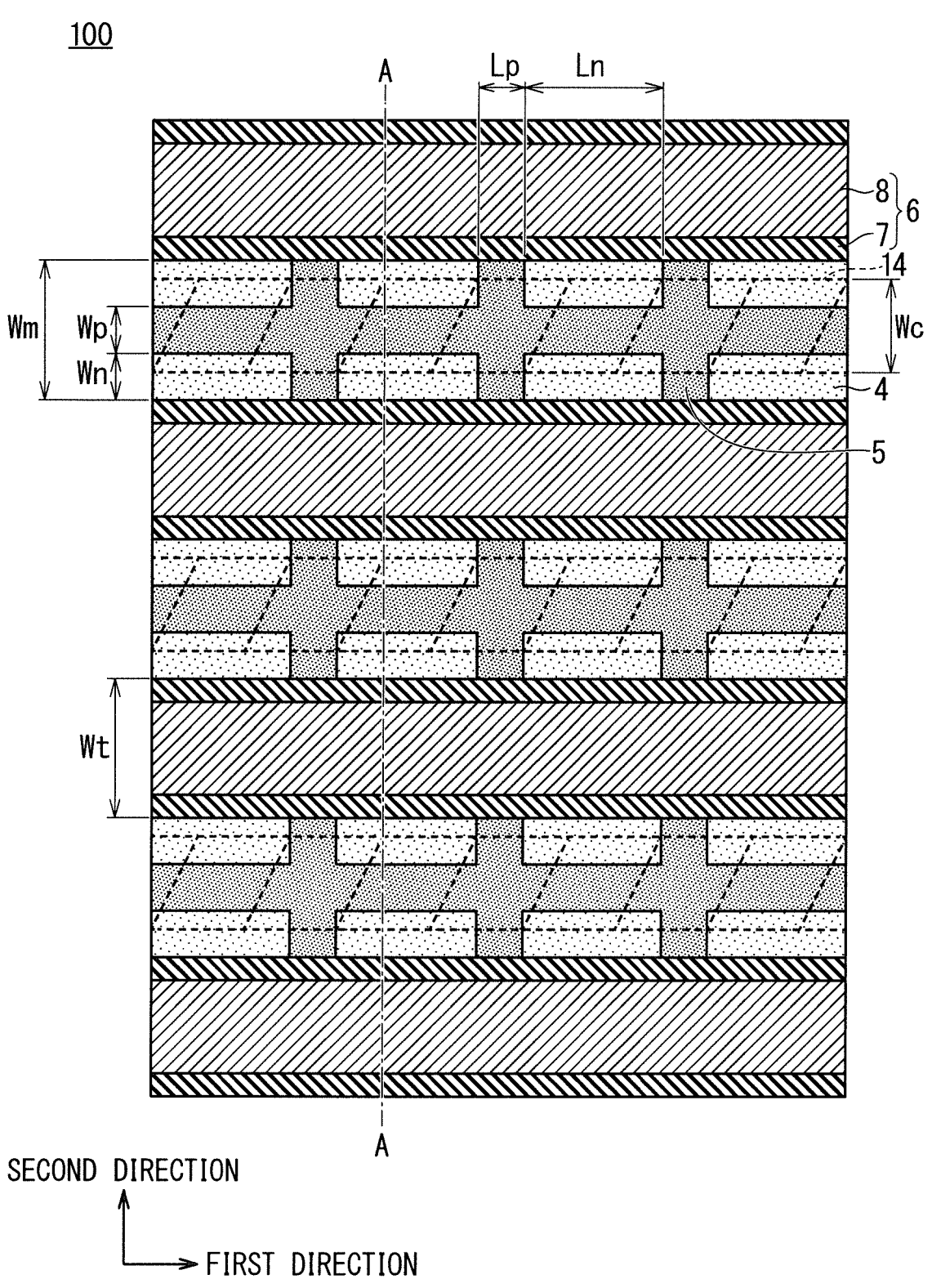
SECOND DIRECTION
FIRST DIRECTION

F I G. 2
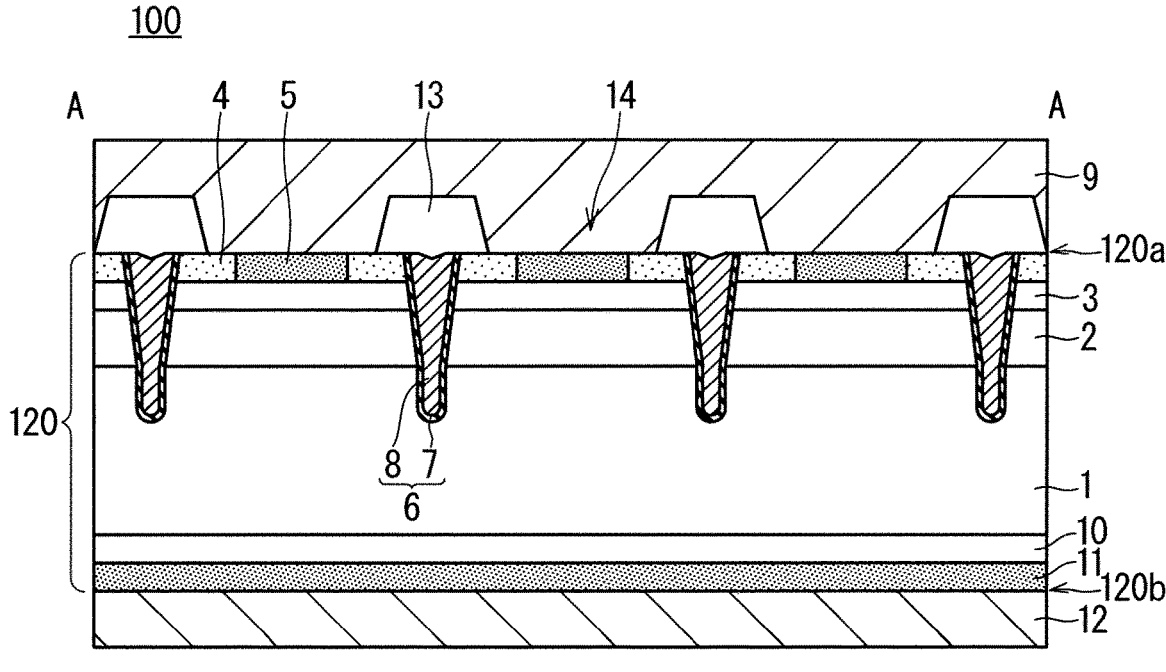
THIRD DIRECTION
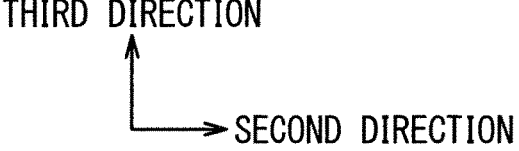
SECOND DIRECTION

F I G. 3
101
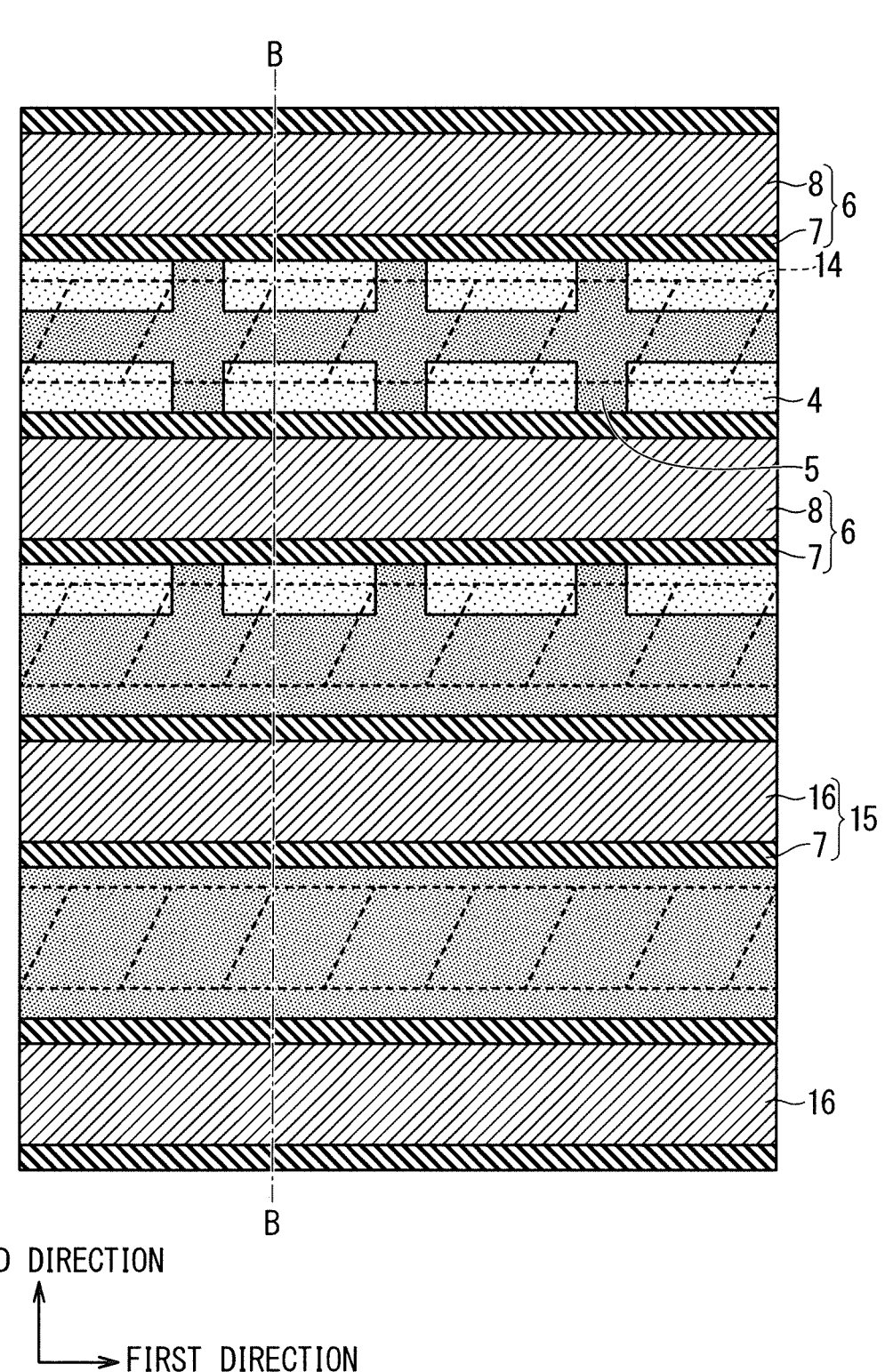
SECOND DIRECTION
FIRST DIRECTION

F I G.  4
101
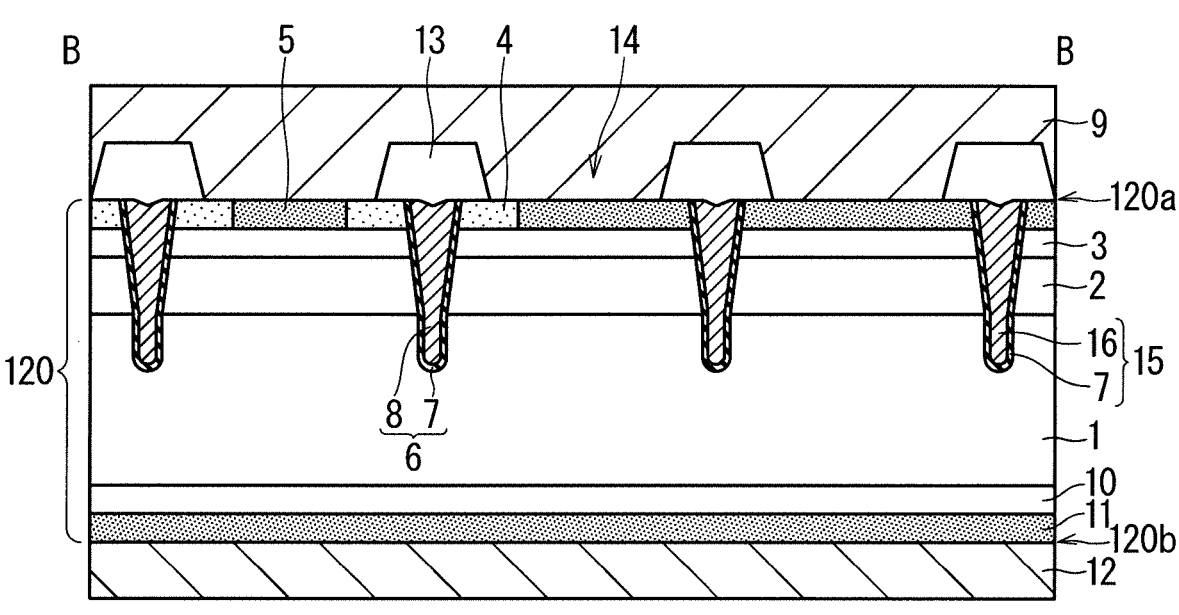
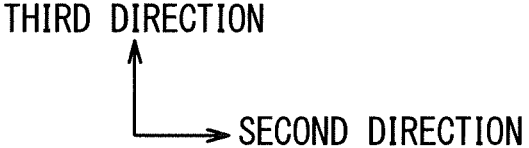
THIRD DIRECTION
SECOND DIRECTION

F I G.  5
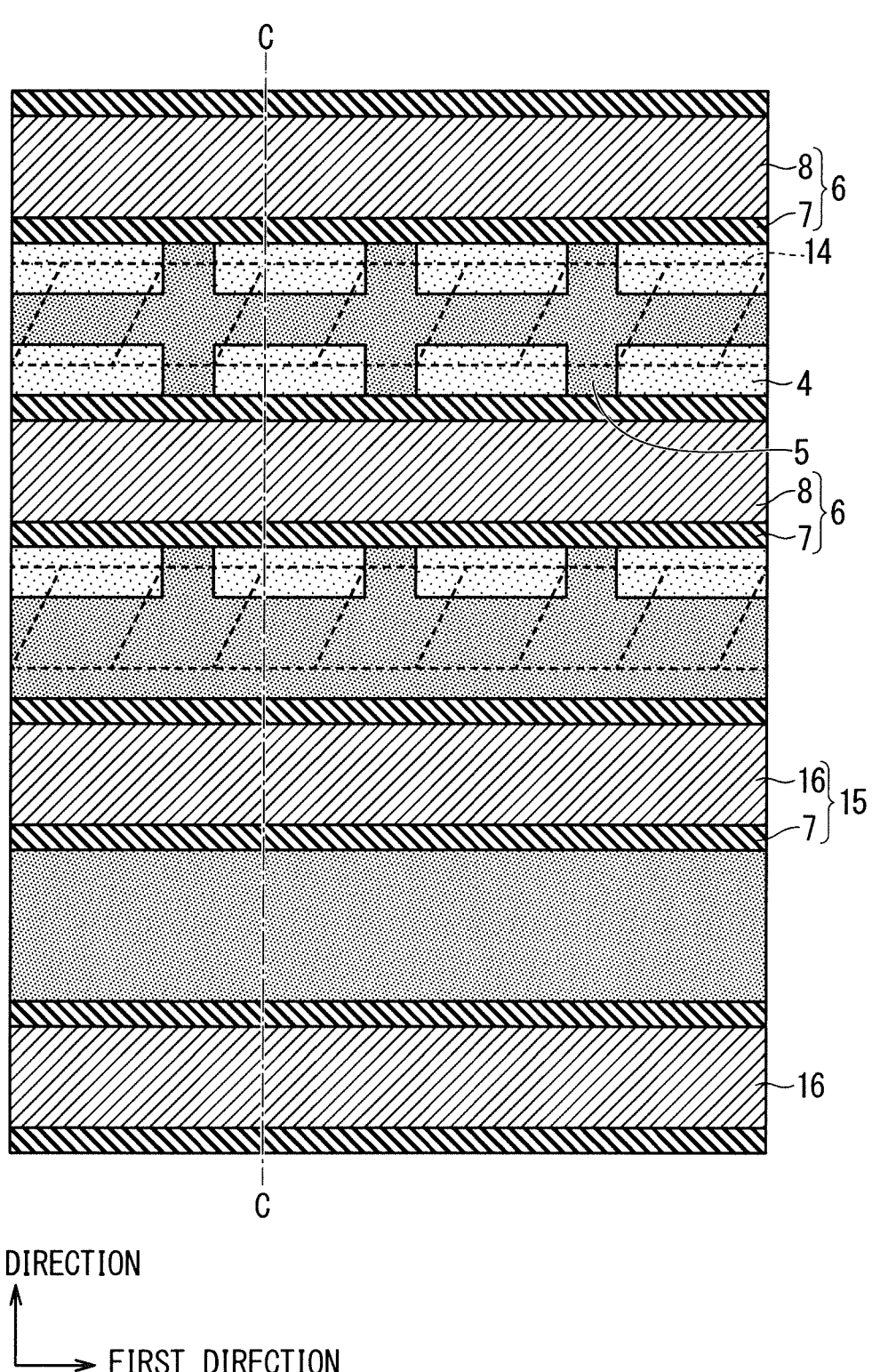
SECOND DIRECTION
FIRST DIRECTION

F I G .  6
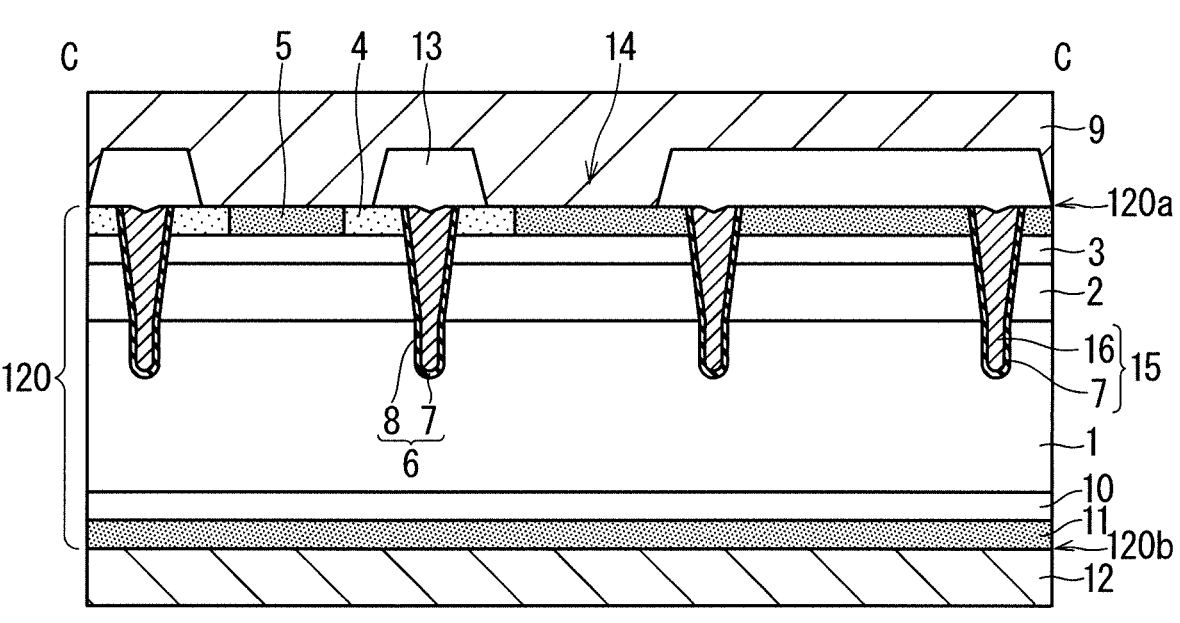
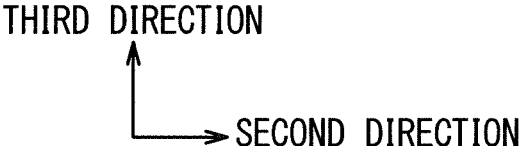

103

SECOND DIRECTION

FIRST DIRECTION

F I G .  8
103
Sp   Sp   Sp   Sp   Sp
8
7 } 6
14
4
5
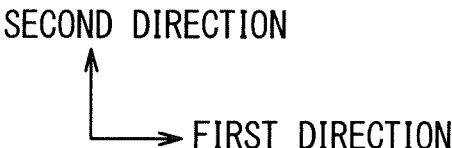
SECOND DIRECTION
FIRST DIRECTION F I G.  9
104
Ln'
8 } 6
7 }
14
Wm   Wp   Wn'
Wn
4
5
4a
4a
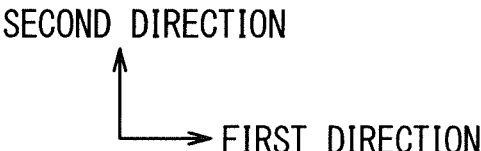
SECOND DIRECTION
FIRST DIRECTION FIG. 10
104
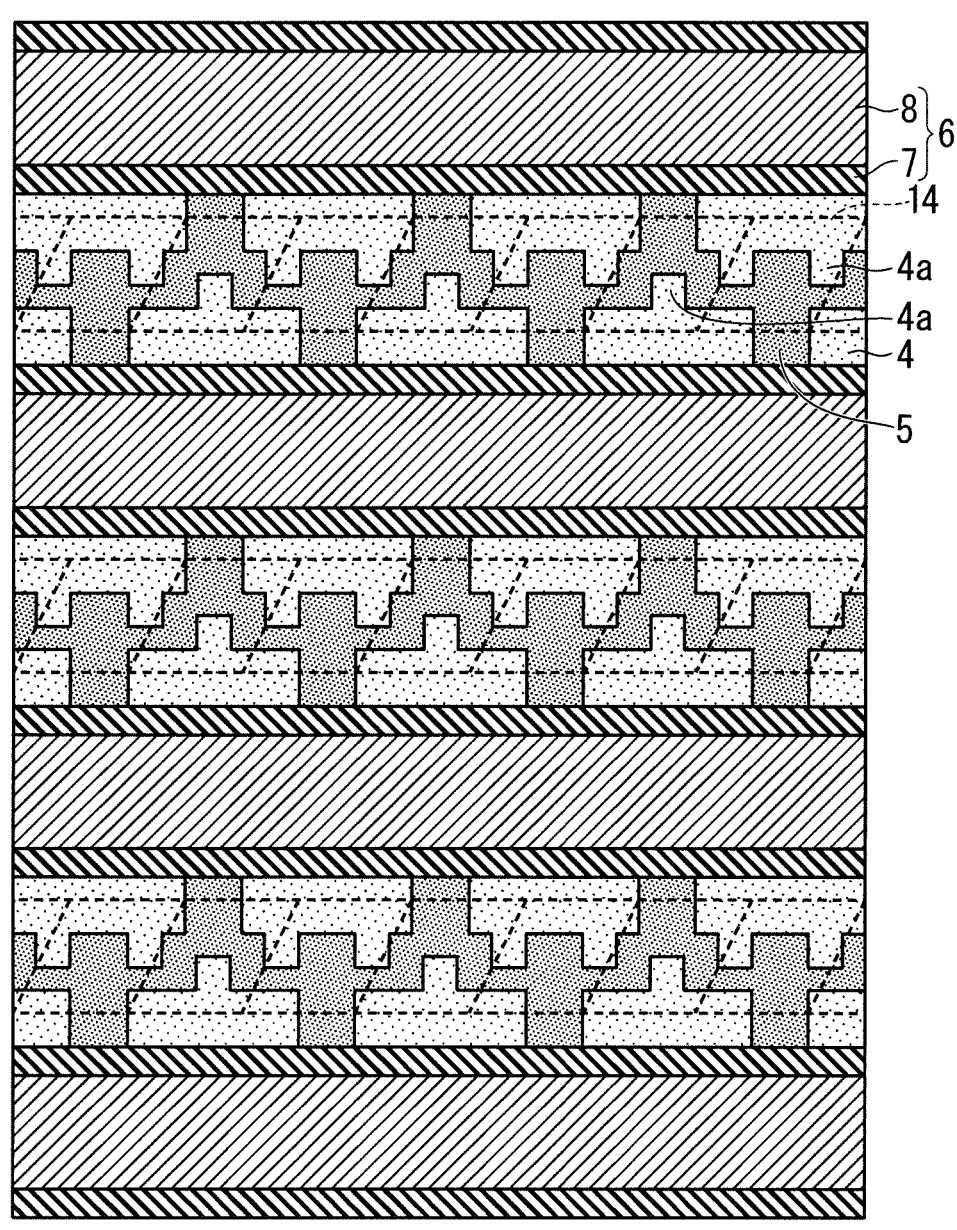
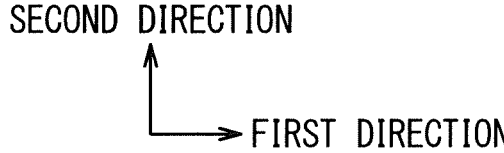
SECOND DIRECTION
FIRST DIRECTION F I G.  1 1
105
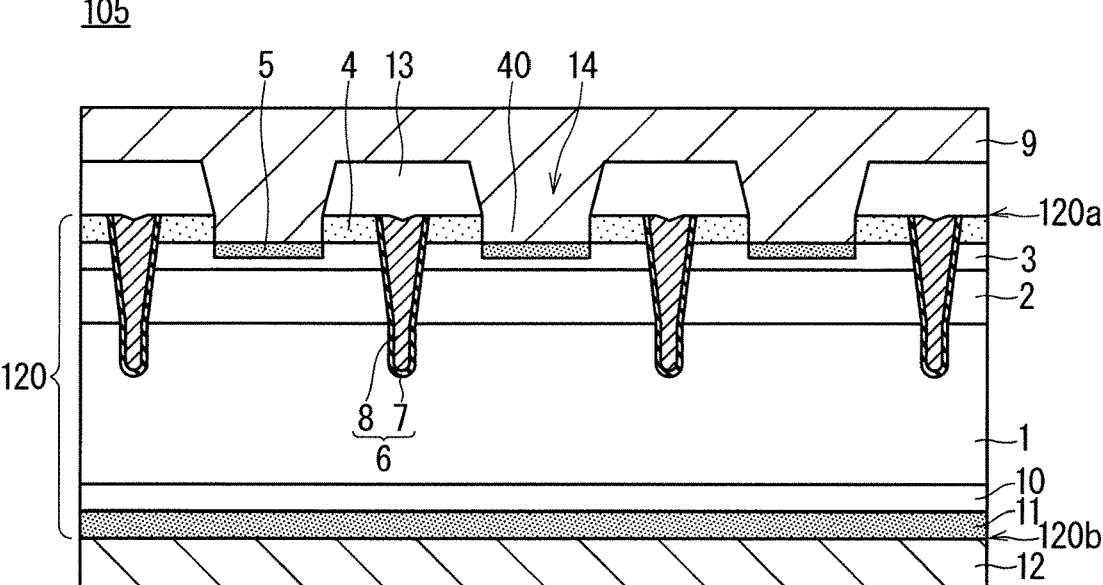
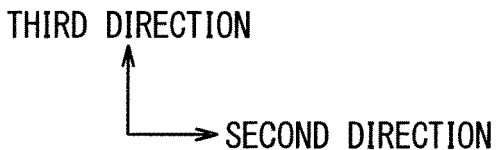
F I G.  1 2
106
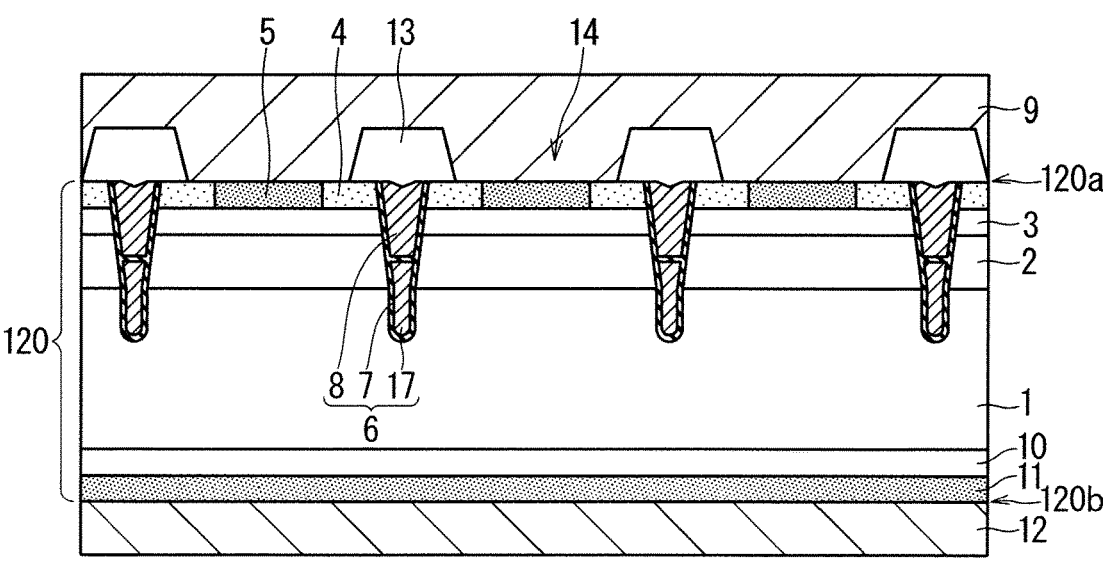
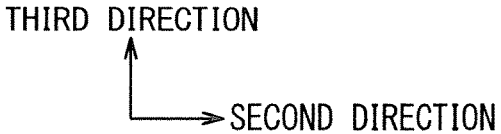

F I G.  1 3
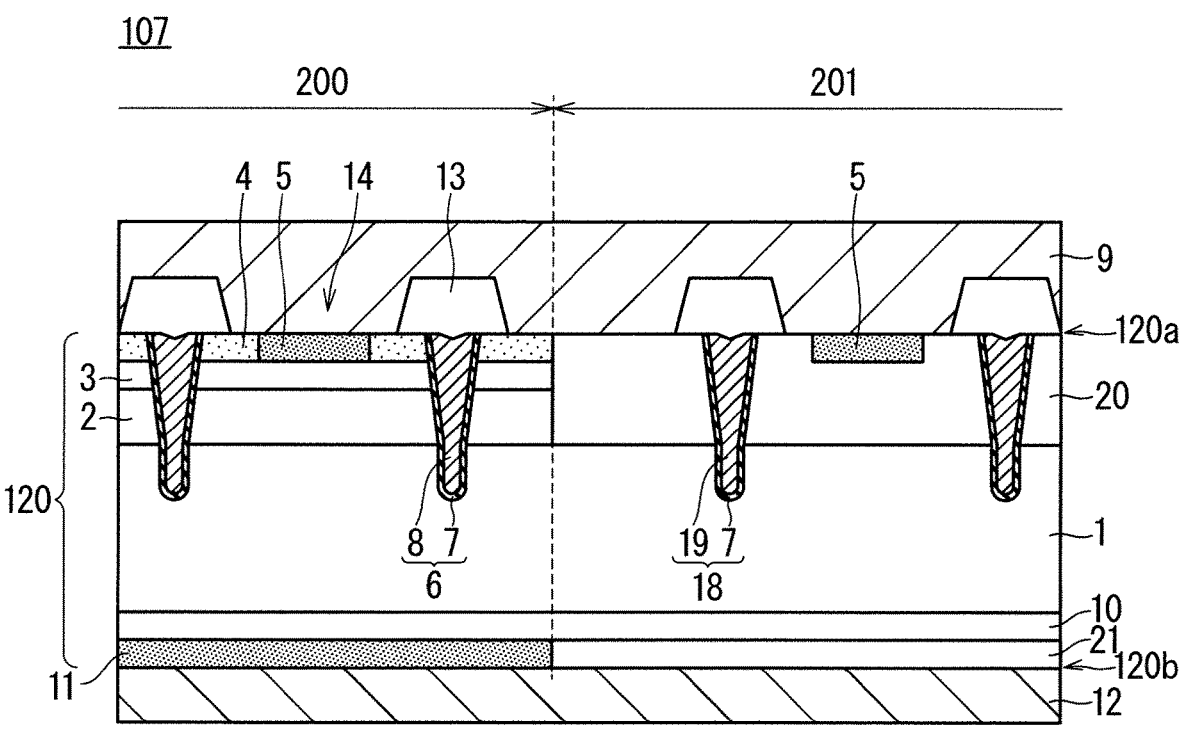
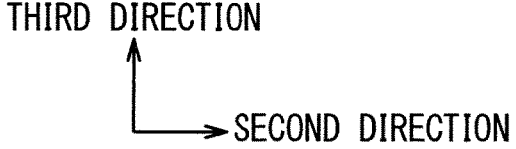
THIRD DIRECTION
SECOND DIRECTION

F I G.   1 4
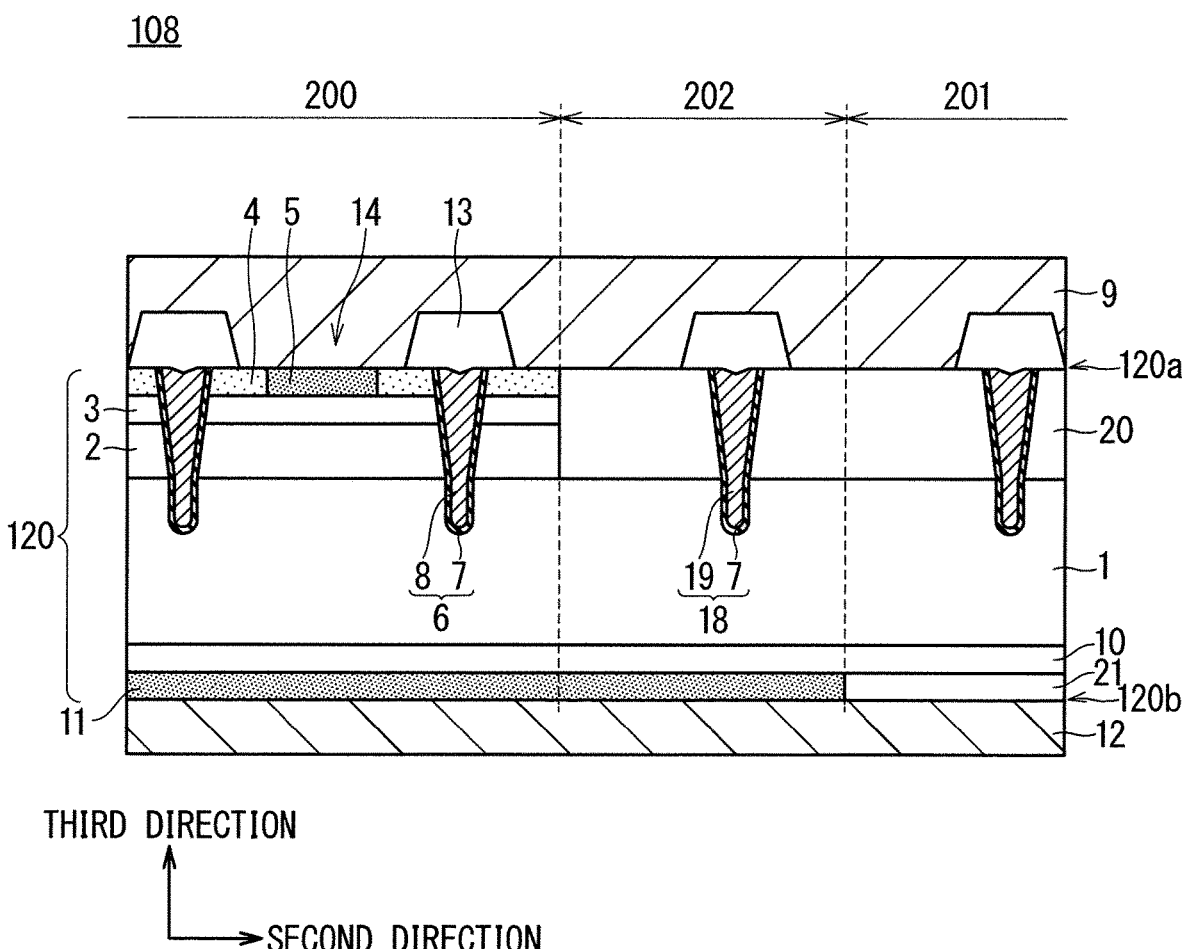
THIRD DIRECTION
SECOND DIRECTION

F I G. 1 5

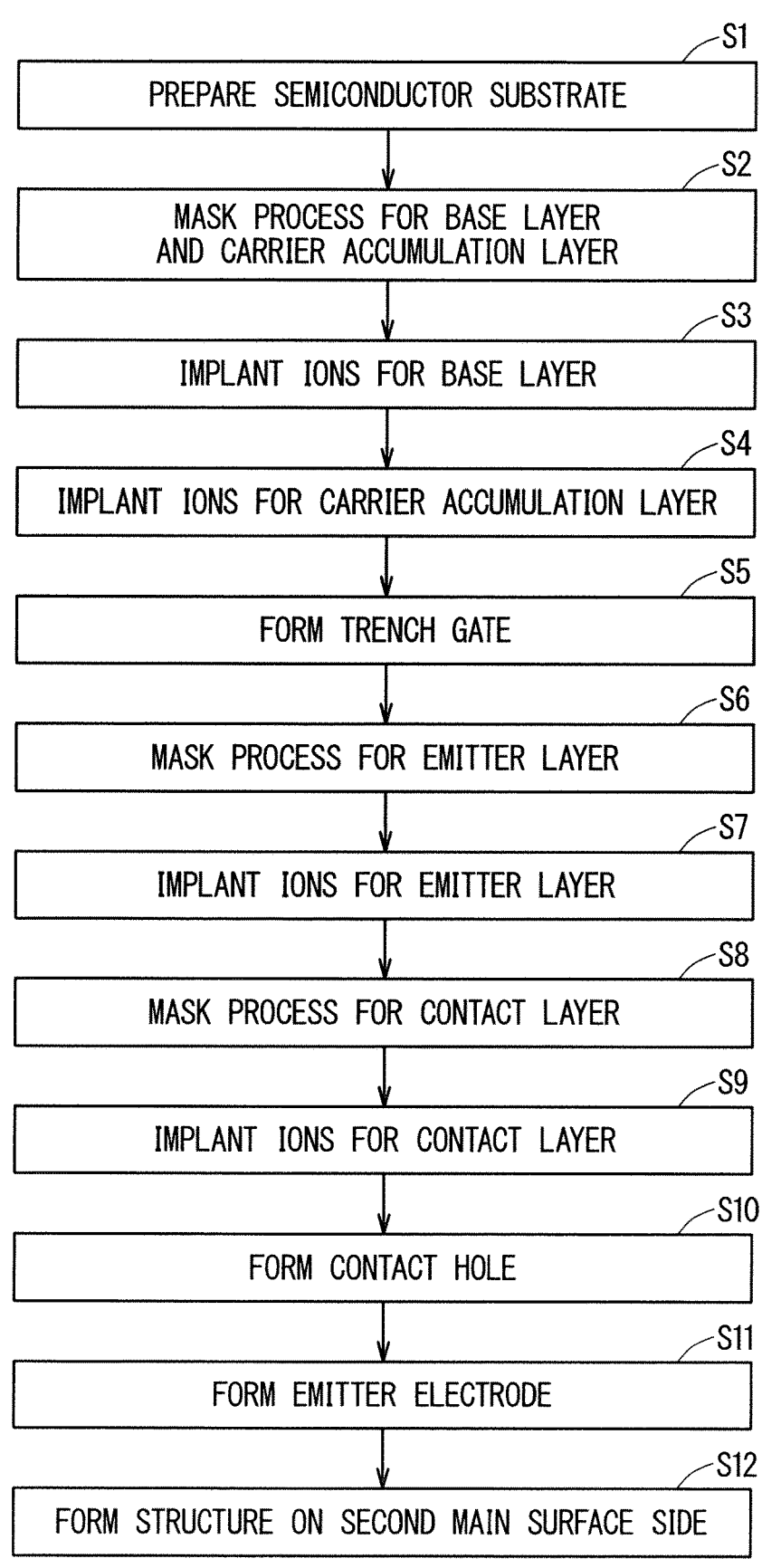

S1
PREPARE SEMICONDUCTOR SUBSTRATE

S2
MASK PROCESS FOR BASE LAYER
AND CARRIER ACCUMULATION LAYER

S3
IMPLANT IONS FOR BASE LAYER

S4
IMPLANT IONS FOR CARRIER ACCUMULATION LAYER

S5
FORM TRENCH GATE

S6
MASK PROCESS FOR EMITTER LAYER

S7
IMPLANT IONS FOR EMITTER LAYER

S8
MASK PROCESS FOR CONTACT LAYER

S9
IMPLANT IONS FOR CONTACT LAYER

S10
FORM CONTACT HOLE

S11
FORM EMITTER ELECTRODE

S12
FORM STRUCTURE ON SECOND MAIN SURFACE SIDE

F I G. 1 6
THIRD DIRECTION
SECOND DIRECTION

F I G.  1 7
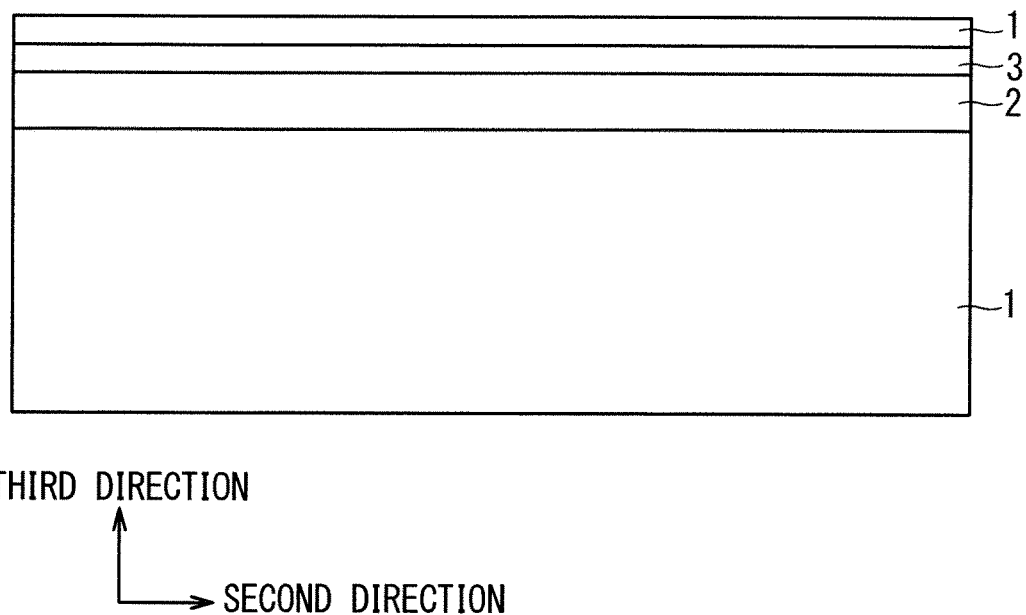
THIRD DIRECTION
SECOND DIRECTION
F I G.  1 8
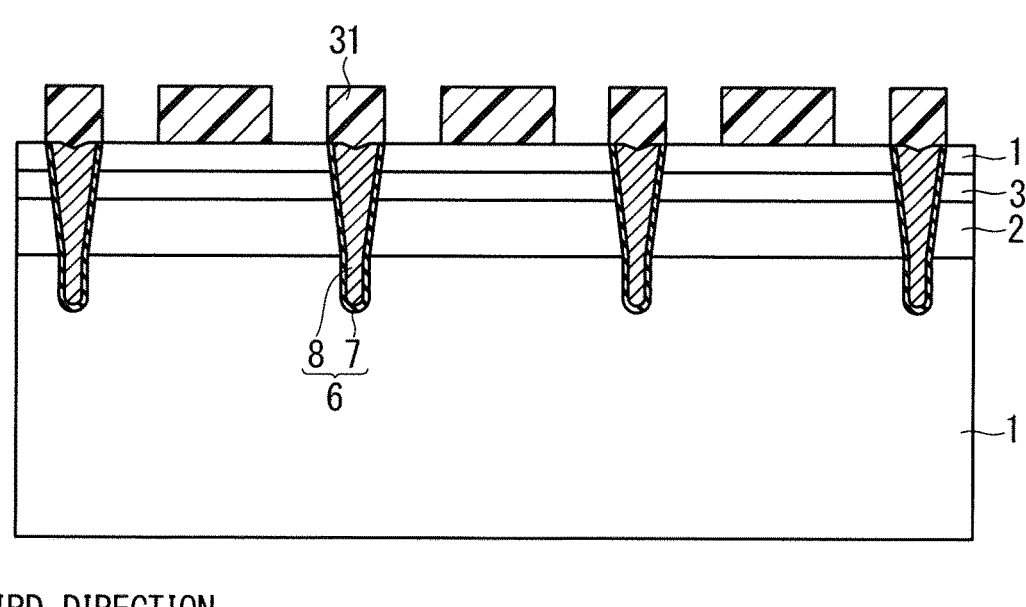
THIRD DIRECTION
SECOND DIRECTION FIG. 19
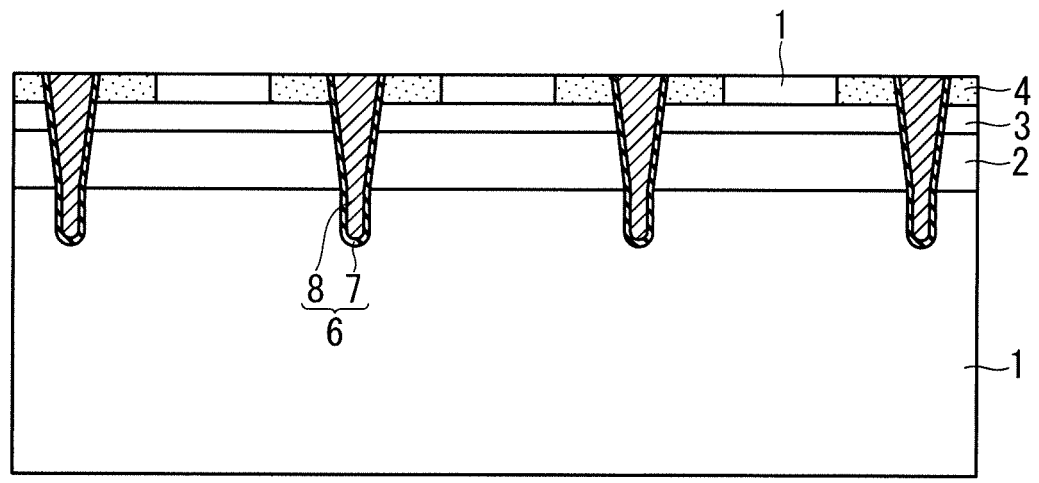
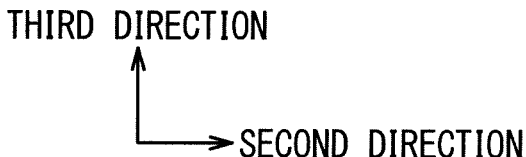
THIRD DIRECTION
SECOND DIRECTION
FIG. 20
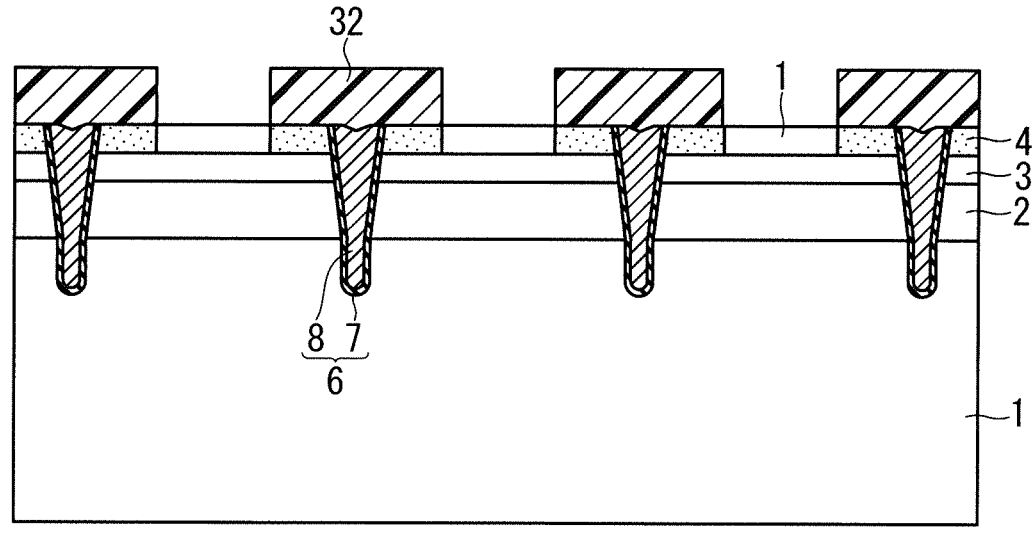
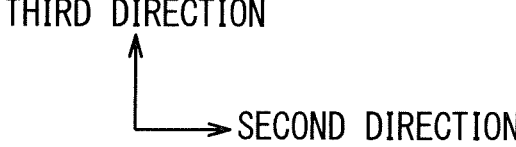
THIRD DIRECTION
SECOND DIRECTION F I G.  2 1
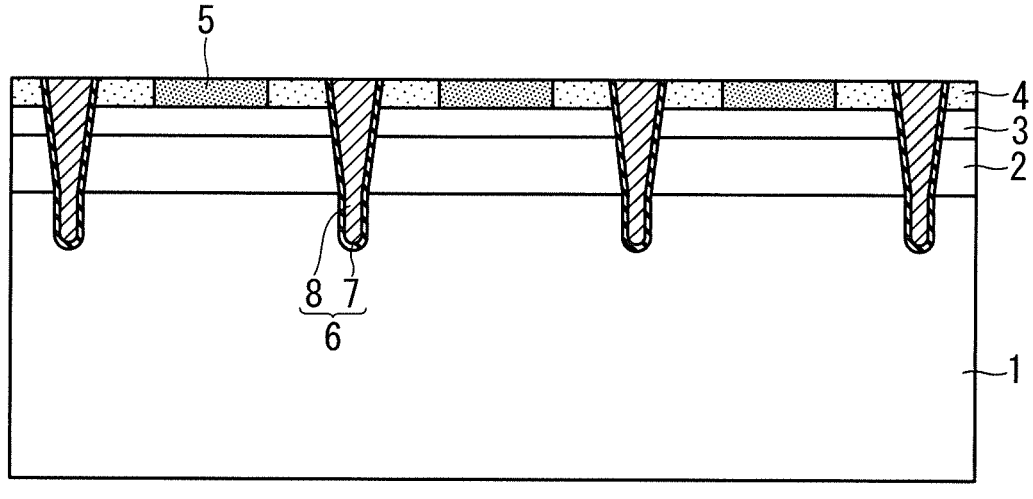
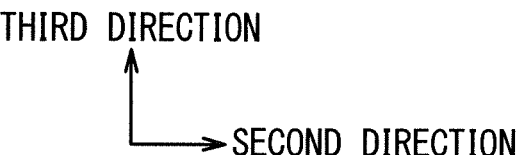

F I G . 2 2
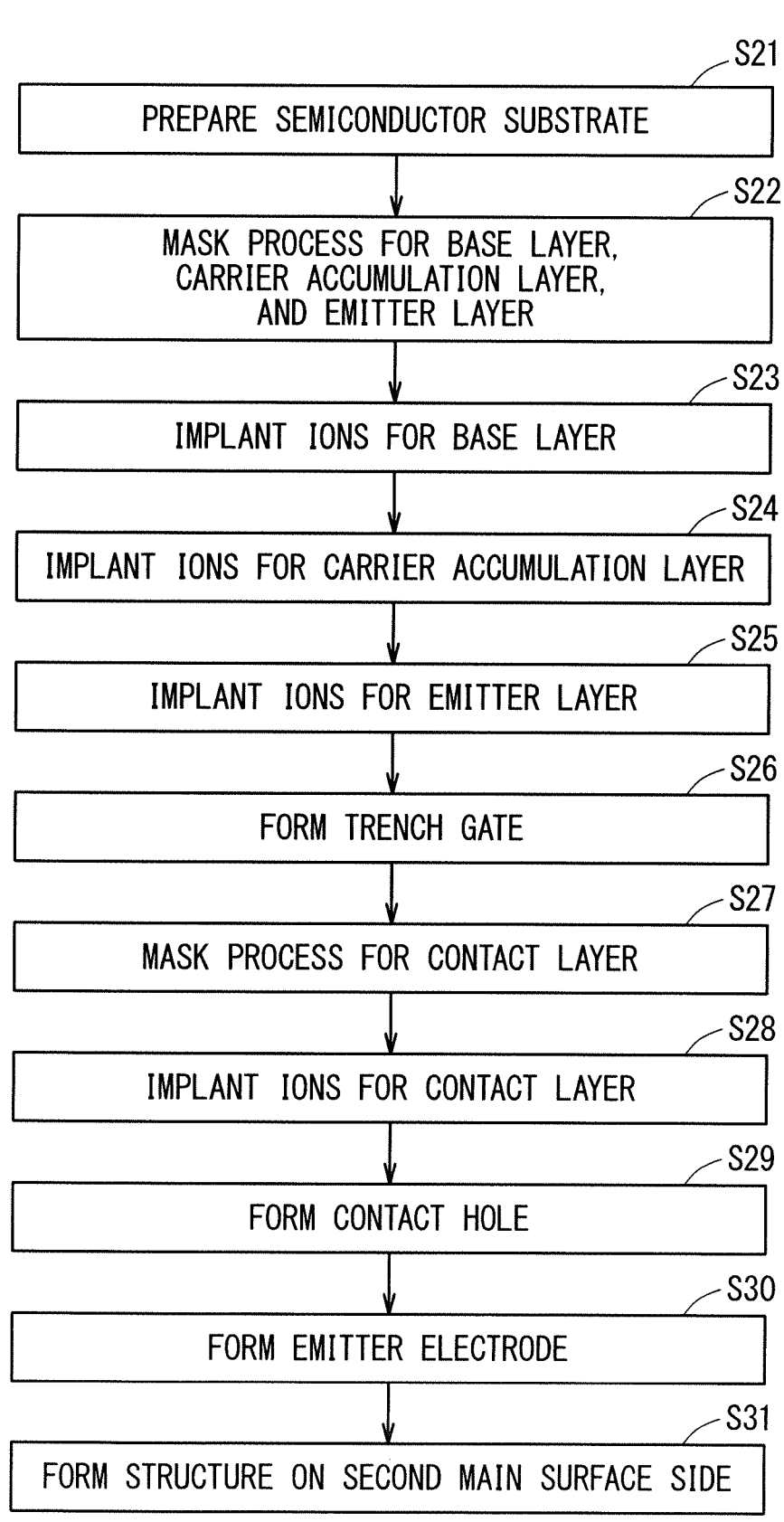

F I G. 2 3
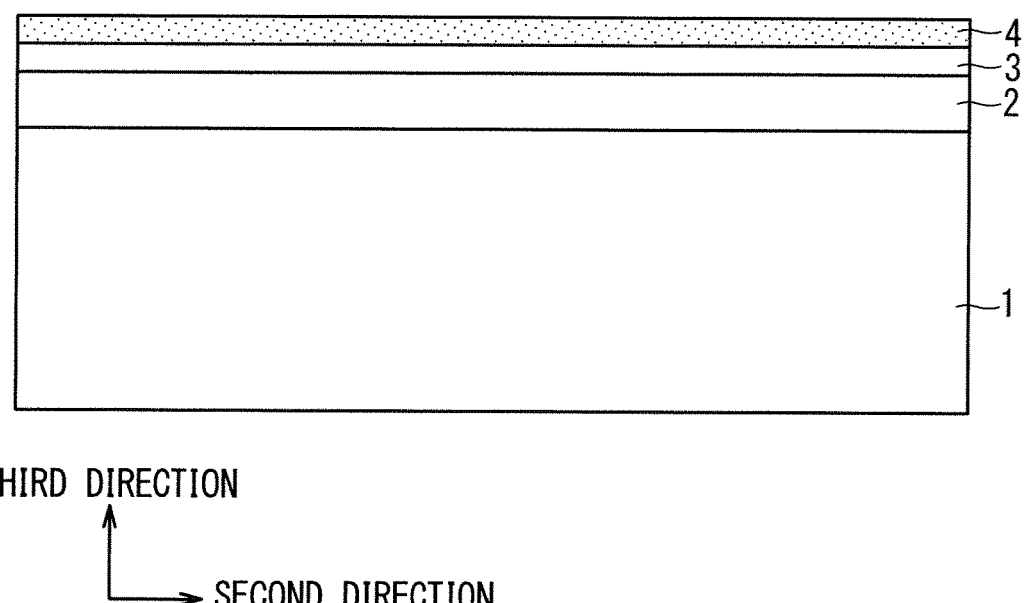
THIRD DIRECTION
SECOND DIRECTION
F I G. 2 4
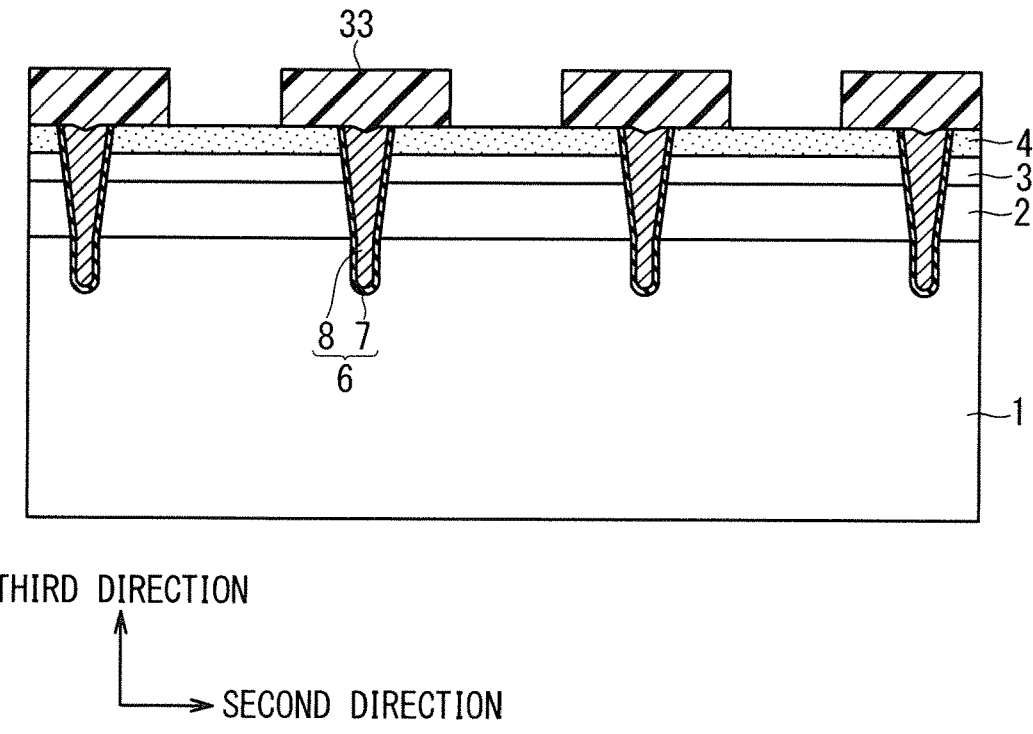
THIRD DIRECTION
SECOND DIRECTION

SEMICONDUCTOR DEVICE AND METHOD FOR MANUFACTURING SEMICONDUCTOR DEVICE

BACKGROUND OF THE INVENTION

Field of the Invention

The present disclosure relates to a semiconductor device and a method for manufacturing the semiconductor device.

Description of the Background Art

A switching device having a low on-voltage has been required from the viewpoint of energy saving. Examples of the switching device having a low on-voltage include an insulated gate bipolar transistor (IGBT) of a trench gate type. Japanese Patent Application Laid-Open No. 2000-106434 discloses a structure of a trench gate type IGBT.

In the structure of Japanese Patent Application Laid-Open No. 2000-106434, an emitter layer is disposed in an H shape by partially narrowing the width of the emitter layer, but there is a problem that pinch resistance increases and latch-up tolerance decreases at the intersection of the emitter layer disposed in the H shape. As described above, the structure of Japanese Patent Application Laid-Open No. 2000-106434 is not necessarily suitable for reducing a latch-up.

SUMMARY

An object of the present disclosure is to provide a semiconductor device suitable for reducing a latch-up and a semiconductor device manufacturing method for manufacturing the semiconductor device suitable for reducing a latch-up.

In the semiconductor device of the present disclosure, the semiconductor base body includes: a first semiconductor layer of a first conductivity type, a second semiconductor layer of a second conductivity type provided closer to the first main surface than the first semiconductor layer, a third semiconductor layer of a first conductivity type selectively provided on the first main surface side of the second semiconductor layer, a first electrode electrically connected to the third semiconductor layer, and a fourth semiconductor layer having a higher impurity concentration of a second conductivity type than an impurity concentration of a second conductivity type of the second semiconductor layer and disposed between the second semiconductor layer and the first electrode. In a mesa region sandwiched between adjacent active trenches, the fourth semiconductor layer is disposed between the third semiconductor layer on a side in contact with one active trench and the third semiconductor layer on a side in contact with the other active trench and between the respective regions of the third semiconductor layer discrete in a first direction in plan view.

In the mesa region sandwiched between the adjacent active trenches, the fourth semiconductor layer is disposed between the third semiconductor layer on the side in contact with one active trench and the third semiconductor layer on the side in contact with the other active trench and between the respective regions of the third semiconductor layer discrete in the first direction in plan view, whereby a semiconductor device of the present disclosure is a semiconductor device suitable for reducing a latch-up.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 1 is a plan view of a semiconductor device according to a first preferred embodiment;

FIG. 2 is a cross-sectional view of the semiconductor device of the first preferred embodiment;

FIG. 3 is a plan view of a semiconductor device according to a second preferred embodiment;

FIG. 4 is a cross-sectional view of the semiconductor device according to the second preferred embodiment;

FIG. 5 is a plan view of a semiconductor device according to a third preferred embodiment;

FIG. 6 is a cross-sectional view of the semiconductor device according to the third preferred embodiment;

FIGS. 7 and 8 are each a plan view of a semiconductor device according to a fourth preferred embodiment;

FIGS. 9 and 10 are each a plan view of a semiconductor device according to a fifth preferred embodiment;

FIG. 11 is a cross-sectional view of a semiconductor device of a sixth preferred embodiment;

FIG. 12 is a cross-sectional view of a semiconductor device of a seventh preferred embodiment;

FIG. 13 is a cross-sectional view of a semiconductor device of an eighth preferred embodiment;

FIG. 14 is a cross-sectional view of a semiconductor device of a ninth preferred embodiment;

FIG. 15 is a flowchart illustrating a method for manufacturing a semiconductor device of a tenth preferred embodiment;

FIGS. 16 to 21 are cross-sectional views each illustrating a state of a manufacturing process for the semiconductor device of the tenth preferred embodiment;

FIG. 22 is a flowchart illustrating a method for manufacturing a semiconductor device of an eleventh preferred embodiment; and FIGS. 23 and 24 are cross-sectional views each illustrating a state of a manufacturing process for the semiconductor device of the eleventh preferred embodiment.

DESCRIPTION OF THE PREFERRED EMBODIMENTS

\<Introduction\>

Figure 7:
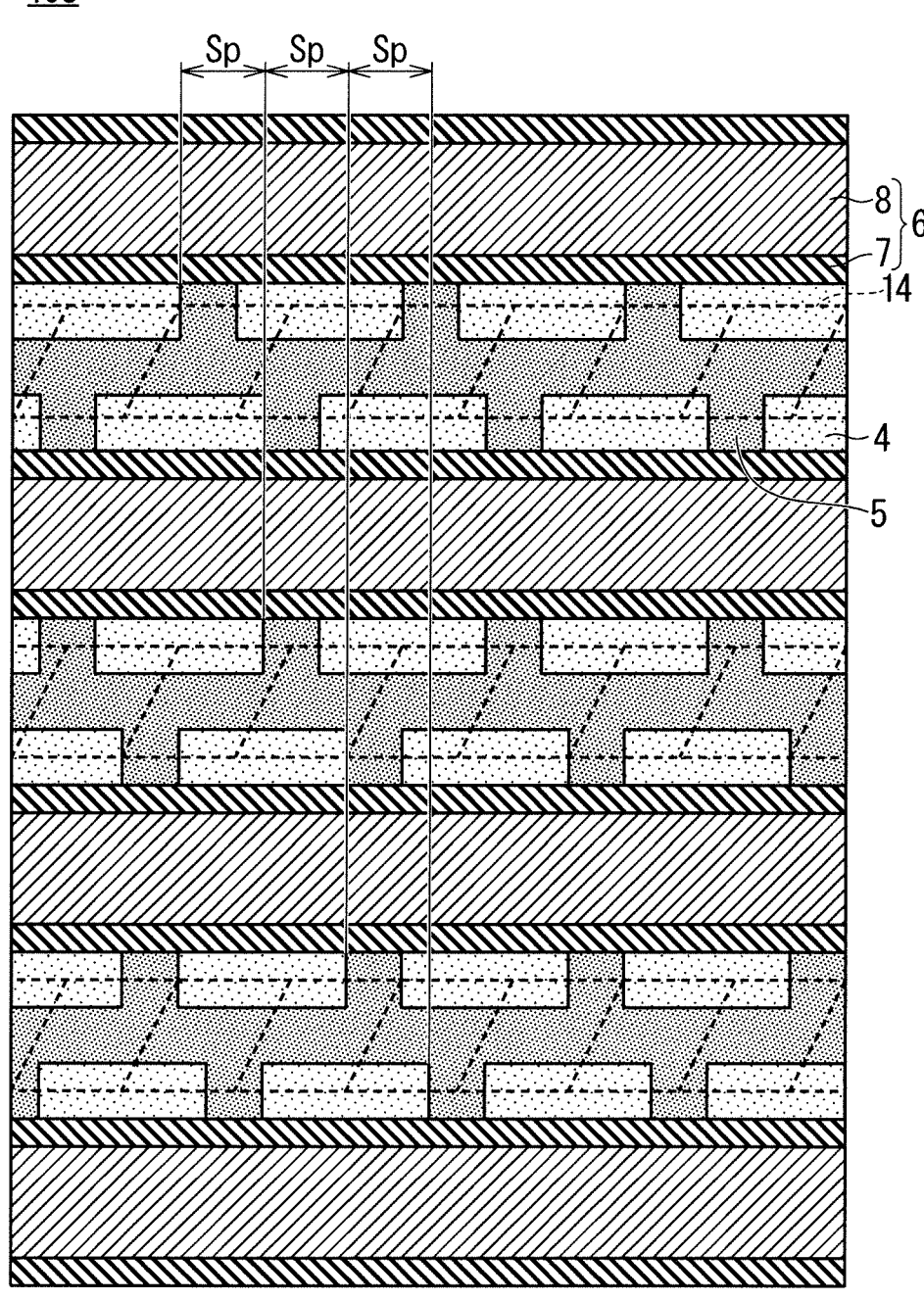

In the following description, n-type and p-type represent the conductivity type of the semiconductor, and in the present disclosure, the first conductivity type is described as n-type and the second conductivity type is described as p-type, but the first conductivity type may be p-type and the second conductivity type may be n-type.

In addition, the drawings are schematically illustrated, and the mutual relationship between the sizes and positions of images illustrated in different drawings is not necessarily accurately described and can be changed appropriately. In the following description, similar components are illustrated with the same reference numeral, and this also applies to the names and functions of the components. Therefore, a detailed description thereof may be omitted.

A. First Preferred Embodiment

A-1. Configuration and Operation

FIG. 1 is a plan view of a semiconductor device 100, and FIG. 2 is a cross-sectional view of the semiconductor device 100 taken along line A-A in FIG. 1.

The semiconductor device 100 includes a semiconductor base body 120 having a first main surface 120*a* and a second main surface 120*b* that is a main surface opposite to the first main surface 120*a*.

An IGBT is provided in an element region (first element region) of the semiconductor base body 120.

In the element region where the IGBT is provided, the semiconductor base body 120 includes: an n-type drift layer 1 (first semiconductor layer); a carrier accumulation layer 2 (eighth semiconductor layer) having an n-type impurity concentration higher than that of the drift layer 1 and provided on the first main surface 120*a* side of the drift layer 1; a p-type base layer 3 provided closer to the first main surface 120*a* than the drift layer 1; an n-type emitter layer 4 (third semiconductor layer) selectively provided on the first main surface 120*a* side of the base layer 3; an emitter electrode 9 (first electrode) electrically connected to the emitter layer 4; a contact layer 5 (fourth semiconductor layer) having a p-type impurity concentration higher than that of the base layer 3 and disposed between the base layer 3 and the emitter electrode 9; a buffer layer 10 that has a higher n-type impurity concentration than the drift layer 1 and is disposed closer to the second main surface 120*b* than the drift layer 1; a p-type collector layer 11 (fifth semiconductor layer) disposed closer to the second main surface 120*b* than the buffer layer 10; and a collector electrode 12 (second electrode) disposed on the second main surface 120*b* side of the semiconductor base body 120. The carrier accumulation layer 2 is provided between the drift layer 1 and the base layer 3. The contact layer 5 is selectively provided on the first main surface 120*a* side of the base layer 3.

In FIG. 2, the semiconductor base body 120 extends from the emitter layer 4 and the contact layer 5 to the collector layer 11. The ends of the emitter layer 4 and the contact layer 5 on a third direction side are the first main surface 120*a*, and the ends of the collector layer 11 on the side opposite to the third direction are the second main surface 120*b*. The thickness of the semiconductor base body 120 may be, for example, 80 μm to 200 μm.

In the element region where the IGBT is provided, the semiconductor base body 120 is provided with a plurality of trenches (first trenches) that penetrate the emitter layer 4 and the base layer 3 from the first main surface 120*a* to reach the drift layer 1. The plurality of trenches (first trenches) extend in the first direction in plan view, and the plurality of active trenches 6 are arranged in a stripe shape in plan view. At the boundary between the drift layer 1 and the carrier accumulation layer 2, the impurity concentration may continuously change, but in this case, a region where the impurity concentration is five times or more of the impurity concentration at the center of the drift layer 1 in the surface layer portion on the first main surface 120*a* side of the region where the drift layer 1 and the carrier accumulation layer 2 are combined may be referred as the carrier accumulation layer 2, and a region where the impurity concentration is less than five times may be referred as the drift layer 1.

In the present preferred embodiment, a plurality of active trenches 6 are provided as the plurality of trenches (first trenches), and in particular, the stripe arrangement of the plurality of trenches (first trenches) has a portion where the active trenches 6 are adjacent to each other.

An active gate electrode 8 is provided in the active trench 6 via the gate insulating film 7 so as to face the base layer 3 (second semiconductor layer).

The emitter electrode 9 is formed on the top of the active gate electrode 8 via an interlayer insulating film 13. The emitter layer 4 and the contact layer 5 are in contact with the emitter electrode 9 via a contact hole 14 which is an opening portion of the interlayer insulating film 13, and the emitter layer 4 and the contact layer 5 are connected to the emitter electrode 9.

The collector layer 11 and the collector electrode 12 are connected electrically.

The drift layer 1 is an n-type semiconductor layer containing, for example, arsenic (As) or phosphorus (P) as n-type impurities, and the n-type impurity concentration is 1.0 E+12/cm$^3$ to 1.0 E+15/cm$^3$.

The carrier accumulation layer 2 is an n-type semiconductor layer containing, for example, arsenic or phosphorus as n-type impurities, and the n-type impurity concentration is 1.0 E+13/cm$^3$ to 1.0 E+17/cm$^3$. Note that the semiconductor device 100 may have a configuration in which the carrier accumulation layer 2 is not provided and the drift layer 1 is also provided in the region of the carrier accumulation layer 2 illustrated in FIG. 2.

The base layer 3 is a p-type semiconductor layer containing, for example, boron (B) or aluminum (Al) as p-type impurities, and the concentration of the p-type impurity is 1.0 E+12/cm$^3$ to 1.0 E+19/cm$^3$.

The emitter layer 4 is an n-type semiconductor layer containing, for example, arsenic or phosphorus as n-type impurities, and the n-type impurity concentration is 1.0 E+17/cm$^3$ to 1.0 E+20/cm$^3$.

The contact layer 5 is a p-type semiconductor layer containing, for example, boron or aluminum as a p-type impurity, and the concentration of the p-type impurity is 1.0 E+15/cm$^3$ to 1.0 E+20/cm$^3$.

The buffer layer 10 is an n-type semiconductor layer and may be formed, for example, by injecting phosphorus or proton (H$^+$) or by injecting both phosphorus and proton (H$^+$). The n-type impurity concentration of the buffer layer 10 is 1.0 E+12/cm$^3$ to 1.0 E+18/cm$^3$.

The collector layer 11 is a p-type semiconductor layer having a p-type impurity such as boron or aluminum, and the p-type impurity concentration is 1.0 E+16/cm$^3$ to 1.0 E+20/cm$^3$.

The active gate electrode 8 may be made of polysilicon or metal to which phosphorus or the like is added.

The emitter electrode 9 may be made of, for example, aluminum (Al), aluminum silicon (AlSi), or the like, may include a barrier metal made of titanium (Ti), titanium nitride (TiN), titanium silicon (TiSi), or the like, and may include a plug made of tungsten (W) or the like.

In a mesa region M sandwiched between adjacent active trenches 6 among mesa regions that are regions each sandwiched between adjacent trenches, the emitter layer 4 has regions discretely arranged in the first direction so as to be in contact with one of the adjacent active trenches 6 and not in contact with the other active trench 6, and regions discretely arranged in the first direction so as to be in contact with the other active trench 6 and not in contact with the one active trench 6.

In the mesa region M sandwiched between the adjacent active trenches 6, the contact layer 5 is disposed between the emitter layer 4 on the side in contact with the one active trench 6 and the emitter layer 4 on the side in contact with the other active trench 6 and between the respective regions of the emitter layer 4 discrete in the first direction in plan view. In particular, the contact layer 5 has a continuous region in contact with both of the adjacent active trenches 6 and including a plurality of regions of the emitter layer 4, discrete in the first direction, with respect to a position in the first direction.

In the semiconductor device 100, the current of the holes flowing immediately below the emitter layer 4 flows not only in the first direction but also in a second direction and escapes to the contact layer 5, so that the latch-up tolerance can be increased compared to a case where the emitter layer 4 is connected from one active trench 6 to the other active trench 6 As described above, the semiconductor device 100 is suitable for reducing a latch-up.

The width in the first direction where one of the discrete regions of the emitter layer 4 is in contact on the sidewall of the active trench 6 is larger than the width in the first direction between the discrete regions of the emitter layer 4 adjacent in the first direction on the sidewall of the active trench 6.

When the width in the first direction of one discrete region of the emitter layer 4 is Ln and the width in the first direction between discrete regions of the emitter layer 4 on the sidewall of the active trench 6 is Lp, Ln>Lp is satisfied. Ln and Lp may be about 0.1 to 50.0 μm. By setting Ln>Lp, the density of the emitter layer 4 can be increased to increase the saturation current. The value of the saturation current can be adjusted by adjusting Lp. Although Ln and Lp may be different depending on each discrete region of the emitter layer 4, in that case, for example, Ln>Lp is satisfied when the width in the first direction in which the one discrete region of the emitter layer 4 is in contact with the sidewall of the active trench 6 is defined as Ln, and on the sidewall of the active trench 6, the interval between the one discrete region and one discrete region adjacent to the one discrete region in the first direction is defined as Lp.

In the second direction orthogonal to the first direction, when the width of the active trench 6 is Wt, the width in which the mesa region M of the semiconductor base body 120 is exposed to the first main surface 120*a* is Wm, the width of the emitter layer 4 is Wn, the width of the contact layer 5 is Wp, and the width of the contact hole 14 is Wc (cf. FIG. 1), Wt and Wm may be about 0.3 to 10.0 μm, and Wn may be about 0.1 to 2.0 μm. Wp may be 0.1 μm or more. The width Wc of the contact hole 14 is a width in the second direction of the region where the interlayer insulating film 13 is not provided on the first main surface 120*a* of the semiconductor base body 120.

For preventing a short circuit between the active gate electrode 8 and the emitter electrode 9, Wc<Wm−0.02 μm is desirable, and for preventing insulation between the emitter layer 4 and the emitter electrode 9, We>Wp+0.02 μm is desirable.

In the semiconductor device 100, the current of the holes flowing immediately below the emitter layer 4 flows not only in the first direction but also in the second direction and escapes to the contact layer 5, so that the latch-up tolerance can be increased compared to a case where the emitter layer 4 is connected from one active trench 6 to the other active trench 6 in the mesa region M sandwiched between the adjacent active trenches 6. Further, the latch-up tolerance can be further increased by reducing Wn.

In the trench gate type IGBT, the saturation current can be increased by increasing the ratio of the emitter layer, but there is a problem that simply increasing the ratio of the emitter layer decreases the latch-up tolerance. This is because when the emitter layer is widened so as to increase the ratio of the emitter layer, the pinch resistance immediately below the emitter layer increases, and when the interval between the emitter layers is narrowed, the emitter layers are connected to each other due to lateral diffusion of impurities in the emitter layer at the time of manufacturing. Thus, there is a trade-off between latch-up tolerance and saturation current.

By disposing the emitter layer 4 as described in the present preferred embodiment, the trade-off between the latch-up tolerance and the saturation current can be improved, and for example, the semiconductor device 100 having a high latch-up tolerance and a high saturation current can be provided.

<A-2. Effect>

In the semiconductor device 100, in a mesa region M sandwiched between adjacent active trenches 6, the emitter layer 4 has regions discretely arranged in the first direction so as to be in contact with one of the adjacent active trenches 6 and not in contact with the other active trench 6, and regions discretely arranged in the first direction so as to be in contact with the other active trench 6 and not in contact with the one active trench 6. In the mesa region M sandwiched between the adjacent active trenches 6, the contact layer 5 is disposed between the emitter layer 4 on the side in contact with one active trench 6 and the emitter layer 4 on the side in contact with the other active trench 6 and between the respective regions of the emitter layer 4 discrete in the first direction in plan view, whereby the semiconductor device 100 is a semiconductor device suitable for reducing a latch-up.

In the semiconductor device 100, the width in the first direction where one of the discrete regions of the emitter layer 4 is in contact on the sidewall of the active trench 6 is larger than the width in the first direction between the discrete regions of the emitter layer 4 adjacent in the first direction on the sidewall of the active trench 6. Thus, the saturation current can be increased.

B. Second Preferred Embodiment

FIG. 3 is a plan view of a semiconductor device 101 that is an IGBT, and FIG. 4 is a cross-sectional view of the semiconductor device 101 taken along line B-B in FIG. 3.

In the semiconductor device 101, dummy trenches 15 are provided as some of a plurality of trenches (first trenches) penetrating the base layer 3 and the carrier accumulation layer 2 from the first main surface 120*a* of the semiconductor base body 120 to reach the drift layer 1. A dummy gate electrode 16 is formed in the dummy trench 15 via a gate insulating film 7. The dummy gate electrode 16 is electrically connected to the emitter electrode 9. The arrangement of the plurality of trenches (first trenches) of the semiconductor device 101 has a portion where the active trenches 6 are adjacent to each other, and the arrangement of the emitter layer 4 and the contact layer 5 in the mesa region M sandwiched between the adjacent active trenches 6 is similar to that described in the first preferred embodiment.

In the semiconductor device 101, the emitter layer 4 is formed so as not to be in contact with the sidewall of the dummy trench 15. The semiconductor device 101 has a mesa region M sandwiched between the active trench 6 and the dummy trench 15, and in the mesa region M, the emitter layer 4 has regions discretely arranged in the first direction so as to be in contact with the active trench 6 and not in contact with the dummy trench 15. In such a configuration as well, the current of the holes flowing immediately below the emitter layer 4 in the mesa region M sandwiched between the active trench 6 and the dummy trench 15 flows in both the first direction and the second direction and escapes to the contact layer 5, which is suitable for reducing a latch-up.

In the IGBT having the carrier accumulation layer, in order to deplete the carrier accumulation layer at the time of maintaining the withstand voltage, it is necessary to narrow the pitch of the trenches to a certain value or less, and it is difficult to reduce the parasitic capacitance of a chip. In the semiconductor device 101, as compared to the first preferred embodiment, by adding the dummy trenches 15, it is possible to reduce the parasitic capacitance of the chip while maintaining the withstand voltage by setting the pitch of the trenches to be equal to or less than a certain value.

In the configuration having both the active trench 6 and the dummy trench 15, by arranging the active trenches 6 adjacently, it is possible to reduce the coupling capacitance between the active trench 6 and the dummy trench 15 and to reduce the parasitic capacitance of the chip.

C. Third Preferred Embodiment

FIG. 5 illustrates a plan view of a semiconductor device 102 that is an IGBT, and FIG. 6 illustrates a cross-sectional view of the semiconductor device 102 taken along line C-C in FIG. 5.

In the semiconductor device 102, the interlayer insulating film 13 is provided between the contact layer 5 and the emitter electrode 9 so as to extend from one to the other of two or more dummy trenches 15 that are continuously adjacent to each other. In particular, the interlayer insulating film 13 is provided in entire region between two or more dummy trenches 15 that are continuously adjacent to each other, and the contact hole 14 is not formed. The contact layer 5 and the emitter electrode 9 are insulated by the interlayer insulating film 13 between two or more dummy trenches 15 that are continuously adjacent to each other. The semiconductor device 102 is similar in other respects to the semiconductor device 101 of the second preferred embodiment.

By reducing the density of the contact holes 14, holes injected from the collector electrode 12 are accumulated in the vicinity of the first main surface 120a, and the on-voltage can be reduced.

D. Fourth Preferred Embodiment

FIGS. 7 and 8 are plan views of a semiconductor device 103 that is an IGBT. The configuration of the semiconductor device 103 is similar to that of the semiconductor device 100 of the first preferred embodiment except that the arrangement of the emitter layers 4 in the first direction differs depending on the position in the second direction.

In the semiconductor device 103, for example, as illustrated in FIGS. 7 and 8, the emitter layer 4 in the first direction is disposed differently between one active trench 6 side and the other active trench 6 side across the mesa region M and is particularly disposed so as to be shifted by a width Sp in the first direction between one active trench 6 side and the other active trench 6 side. In the example illustrated in FIG. 7, the arrangement of the emitter layer 4 in the first direction is the same on both sides of the active trench 6, but in the example illustrated in FIG. 8, the arrangement of the emitter layer 4 in the first direction is also arranged at both sides of the active trench 6 with a deviation by a width Sp.

The arrangement of the emitter layer 4 in the first direction may be the same on one active trench 6 side and the other active trench 6 side sandwiching the mesa region M and be different on both sides of the active trench 6.

By making the arrangement of the emitter layer 4 in the first direction different in the second direction, the current injected from the emitter layer 4 is dispersed, and the uniformity of heat generation in the chip can be increased.

E. Fifth Preferred Embodiment

FIGS. 9 and 10 are plan views of a semiconductor device 104 that is an IGBT.

The configuration of the semiconductor device 104 differs from that of the semiconductor device 100 of the first preferred embodiment in the shape of each discrete region of the emitter layer 4. The semiconductor device 104 is similar in other respects to the semiconductor device 100.

As illustrated in FIGS. 9 and 10, in the semiconductor device 104, a part of the width Wn in the second direction has been broadened in a part in the first direction, and the emitter layer 4 has a protrusion 4a protruding in the second direction. That is, the region discrete in the first direction of the emitter layer 4 includes a region where the width in the second direction perpendicular to the first direction has been broadened in a partial region in the first direction.

One or more protrusions 4a may be formed for one of the discretely formed regions of the emitter layer 4, may be formed at a different position for each discretely formed region of the emitter layer 4, or may be formed only in some of the discretely formed regions of the emitter layer 4.

When the width of the protrusion 4a in the second direction is Wn', and the width thereof in the first direction is Ln', Wn'<Wp and Ln'≤Wn are satisfied.

With the configuration of the present preferred embodiment, it is possible to reduce the contact resistance between the emitter layer 4 and the emitter electrode 9 while maintaining the latch-up tolerance.

F. Sixth Preferred Embodiment

FIG. 11 is a cross-sectional view of a semiconductor device 105 that is an IGBT.

In the semiconductor device 105, the contact hole 14 is formed deeply so that it extend to the second main surface 120b side of the first main surface 120a. That is, in the element region (first element region) where the IGBT of the semiconductor base body 120 is provided, a trench 40 (second trench) is provided from the first main surface 120a of the semiconductor base body 120 toward the second main surface 120b, and the contact hole 14 includes the trench 40.

The emitter layer 4 and the emitter electrode 9 are in contact with each other on the side surface of the trench 40, and the contact layer 5 and the emitter electrode 9 are in contact with each other on the bottom surface of the contact hole 14. The base layer 3 is provided on the second main surface 120b side of the contact layer 5, and the contact layer 5 is disposed between the base layer 3 and the emitter electrode 9.

With the configuration of the present preferred embodiment, holes injected from the collector layer 11 can be easily extracted from the contact layer 5, and the latch-up tolerance can be improved.

G. Seventh Preferred Embodiment

FIG. 12 is a cross-sectional view of a semiconductor device 106 that is an IGBT.

In the semiconductor device 106, the active gate electrode 8 and the shield electrode 17 are formed in the active trench 6 via the gate insulating film 7. The gate insulating film 7 is also provided between the active gate electrode 8 and the shield electrode 17.

A shield electrode 17 is electrically connected to the emitter electrode 9.

The center of the shield electrode 17 in the depth direction (third direction) is located closer to the second main surface 120b than the center of the active gate electrode 8 in the depth direction, and the end of the active gate electrode 8 on the second main surface 120b side is included in a range where the carrier accumulation layer 2 is provided in the depth direction. As described in the first preferred embodiment, at the boundary between the drift layer 1 and the carrier accumulation layer 2, the impurity concentration may continuously change, but in this case, a region where the impurity concentration is five times or more of the impurity concentration at the center of the drift layer 1 in the surface layer portion on the first main surface 120a side of the region where the drift layer 1 and the carrier accumulation layer 2 are combined may be referred as the carrier accumulation layer 2, and a region where the impurity concentration is less than five times may be referred as the drift layer 1.

The parasitic capacitance can be reduced by forming the shield electrode 17 on the second main surface 120b side of the active gate electrode 8. In order to form a channel by inverting a part of the base layer 3 and to connect the emitter layer 4 and the carrier accumulation layer 2 by the channel, the active gate electrode 8 needs to be deeper than the base layer 3, so that the end of the active gate electrode 8 on the second main surface 120b side is included in a range where the carrier accumulation layer 2 is provided in the depth direction (third direction).

H. Eighth Preferred Embodiment

FIG. 13 illustrates a cross-sectional view of the semiconductor device 107.

In the semiconductor device 107, the semiconductor base body 120 has a diode region 201 (second element region) in which a diode is provided, different from the IGBT region 200 (first element region).

In the semiconductor device 107, the IGBT region 200 and the diode region 201 are adjacent in the second direction.

Although the structure of the IGBT region 200 is illustrated in FIG. 13 similarly to that described in the first preferred embodiment, the planar structure and the cross-sectional structure of the IGBT region 200 of the semiconductor device 107 may be those described in any of the first to seventh preferred embodiments, and the effect described in any of the first to seventh preferred embodiments can be obtained in the operation of the IGBT region 200 according to any of the first to seventh preferred embodiments.

The diode region 201 includes the drift layer 1, a p-type anode layer 20 (sixth semiconductor layer) disposed closer to the first main surface 120a than the drift layer 1, a plurality of diode trenches 18 (third trenches) penetrating the anode layer 20 from the first main surface 120a of the semiconductor base body 120 to reach the drift layer 1, a diode trench electrode 19 disposed on the inner wall of the diode trench 18 via the gate insulating film 7, an n-type cathode layer 21 (seventh semiconductor layer) having a higher n-type impurity concentration than that of the drift layer 1 and disposed closer to the second main surface 120b than the drift layer 1, and the collector electrode 12 electrically connected to the cathode layer 21.

The diode trench electrode 19 is electrically connected to the emitter electrode 9.

The anode layer 20 is a p-type semiconductor layer having a p-type impurity such as boron or aluminum, and the p-type impurity concentration is 1.0 E+12/cm³ to 1.0 E+19/cm³.

The cathode layer 21 is an n-type semiconductor layer containing, for example, arsenic or phosphorus as n-type impurities, and the n-type impurity concentration is 1.0 E+16/cm³ to 1.0 E+21/cm³.

The anode layer 20 may be formed in the same process as the base layer 3 or may be formed in another process. In order to reduce the contact resistance with the emitter electrode 9, the contact layer 5 may be formed on a part of the anode layer 20 as illustrated in FIG. 13.

The contact layer 5 is a p-type semiconductor layer containing, for example, boron or aluminum as a p-type impurity, and the concentration of the p-type impurity is 1.0 E+15/cm³ to 1.0 E+20/cm³.

With the configuration of the present preferred embodiment, the semiconductor device 107 can operate as a reverse-conducting IGBT (RC-IGBT).

I. Ninth Preferred Embodiment

FIG. 14 illustrates a cross-sectional view of a semiconductor device 108.

In the ninth preferred embodiment, when the end of the emitter layer 4 is the end of an IGBT region 200, and the end of the cathode layer 21 is the end of the diode region 201 in the second direction, a boundary region 202 is provided between the IGBT region 200 and the diode region 201. The IGBT region 200 and the boundary region 202, as well as the diode region 201 and the boundary region 202, are adjacent in the second direction. The configuration of the IGBT region 200 and the diode region 201 is the same as that of the eighth preferred embodiment.

The structure of the boundary region 202 on the first main surface 120a side may be the same as that of the diode region, and the structure of the boundary region 202 on the second main surface 120b side may be the same as that of the IGBT region 200.

By adding the boundary region 202, it is possible to prevent the flow of holes from the IGBT region 200 into the diode region 201 and to reduce the recovery loss.

J. Tenth Preferred Embodiment

FIG. 15 is a flowchart illustrating a method for manufacturing the semiconductor device according to the tenth preferred embodiment. Although the present preferred embodiment is mainly described assuming a case where the semiconductor device 100 of the first preferred embodiment is manufactured, the present preferred embodiment is also applicable to a manufacturing method for manufacturing any of the semiconductor devices 101 to 108 of other preferred embodiments.

First, a semiconductor substrate constituting the drift layer 1 is prepared (step S1).

Next, as illustrated in FIG. 16, a mask process is applied to the first main surface 120a side of the semiconductor substrate to form a mask 30 (step S2). The mask 30 is used for ion implantation when the base layer 3 is formed and ion implantation when the carrier accumulation layer 2 is formed. For example, as illustrated in FIG. 16, the mask 30 is formed to cover the outer peripheral region 203 of the semiconductor device 100. In the drawings except for FIG. 16, the outer peripheral region 203 is omitted.

Next, ion implantation for forming the base layer 3 (first ion implantation) is performed (step S3), ion implantation for forming the carrier accumulation layer 2 (fourth ion implantation) is performed (step S4), and activation annealing is performed. Thus, the state illustrated in FIG. 17 is achieved. Note that either the ion implantation for the base layer 3 or the ion implantation for the carrier accumulation layer 2 may be performed first.

Next, the active trench 6 is formed (step S5).

A mask process for the emitter layer 4 is then performed to form a mask 31 (step S6). Thus, the state illustrated in FIG. 18 is achieved.

Subsequently, using the mask 31, ion implantation for forming the emitter layer 4 (second ion implantation) is performed (step S7), and activation annealing is performed. Thus, the state illustrated in FIG. 19 is achieved.

A mask process for the contact layer 5 is then performed to form a mask 32 (step S8). Thus, the state illustrated in FIG. 20 is achieved.

Subsequently, ion implantation for forming the contact layer 5 (third ion implantation) is performed (step S9), and activation annealing is performed. Thus, the state illustrated in FIG. 21 is achieved.

Next, an interlayer insulating film 13 is formed so as to form the contact hole 14 (step S10), the emitter electrode 9 is formed (step S11), and the structure on the second main surface 120b side is formed (step S12), whereby the structure of the semiconductor device 100 illustrated in FIG. 2 is obtained.

The step of forming the active trench 6 described in step S5 may be positioned anywhere from a point before the mask process for the base layer 3 and the carrier accumulation layer 2 is performed in step S2 to a point before the interlayer insulating film 13 is formed in step S10.

In order to reduce the manufacturing cost, it is desirable that ion implantation at the time of forming the carrier accumulation layer 2, the base layer 3, the emitter layer 4, and the contact layer 5 be performed once. Thus, the distribution of the impurity concentration of each of the contact layer 5 and the emitter layer 4 in the thickness direction has, for example, only one peak.

The activation annealing of the carrier accumulation layer 2, the base layer 3, the emitter layer 4, and the contact layer 5 may be performed individually or collectively.

When the carrier accumulation layer 2 is not provided in the semiconductor device 100, step S4 is not required.

As described above, the method for manufacturing the semiconductor device according to the present preferred embodiment includes: forming the base layer 3 through the first ion implantation; forming the emitter layer 4 through the second ion implantation; forming the contact layer 5 through the third ion implantation; and forming the carrier accumulation layer 2 through the fourth ion implantation. The same mask 30 is used in the first ion implantation and the fourth ion implantation, and the mask 30 used in the first ion implantation and the fourth ion implantation, the mask 31 used in the second ion implantation, and the mask 32 used in the third ion implantation are different from each other. Thus, the patterns of the emitter layer 4 and the contact layer 5 can be adjusted independently.

K. Eleventh Preferred Embodiment

FIG. 22 illustrates a flowchart of a method for manufacturing a semiconductor device of an eleventh preferred embodiment. Although the present preferred embodiment will be mainly described on the assumption that the semiconductor device 100 of the first preferred embodiment is manufactured, the present preferred embodiment is also applicable to a manufacturing method for manufacturing any of the semiconductor devices 101 to 108 of other preferred embodiments.

First, a semiconductor substrate constituting the drift layer 1 is prepared (step S21).

Next, a mask process is applied to the first main surface 120a side of the semiconductor substrate to form a mask 30 (step S22). The mask 30 is used for ion implantation when the base layer 3 is formed, ion implantation when the carrier accumulation layer 2 is formed, and ion implantation when the emitter layer 4 is formed. For example, as illustrated in FIG. 16, the mask 30 is formed to cover the outer peripheral region 203 of the semiconductor device 100.

Next, ion implantation for forming the base layer 3 (fifth ion implantation) is performed (step S23), ion implantation for forming the carrier accumulation layer 2 (eighth ion implantation) is performed (step S24), ion implantation for forming the emitter layer 4 (sixth ion implantation) is performed (step S25), and activation annealing is performed. Thus, the state illustrated in FIG. 23 is achieved. Note that the order of performing the ion implantation for the base layer 3, the ion implantation for the carrier accumulation layer 2, and the ion implantation for the emitter layer 4 may be switched. Next, the active trench 6 is formed (step S26).

A mask process for the contact layer 5 is then performed to form a mask 33 (step S27). Thus, the state illustrated in FIG. 24 is achieved.

Subsequently, ion implantation for forming the contact layer 5 (seventh ion implantation) is performed (step S28), and activation annealing is performed. Thus, the state illustrated in FIG. 21 is achieved. The ion implantation amount at the time of forming the contact layer 5 in step S28 is higher than the ion implantation amount at the time of forming the emitter layer 4 in step S25, so that the emitter layer 4 implanted with impurity ions in advance can be partially counter-doped to form the contact layer 5.

Next, the interlayer insulating film 13 is formed so as to form the contact hole 14 (step S29), the emitter electrode 9 is formed (step S30), and a structure on the second main surface 120b side is formed (step S31), whereby the structure of the semiconductor device 100 illustrated in FIG. 2 is obtained.

The step of forming the active trench 6 described in step S26 may be positioned anywhere from a point before the mask process for the base layer 3, the carrier accumulation layer 2, and the emitter layer 4 is performed in step S22 to a point before the interlayer insulating film 13 is formed in step S29.

In order to reduce the manufacturing cost, it is desirable that ion implantation at the time of forming the carrier accumulation layer 2, the base layer 3, the emitter layer 4, and the contact layer 5 be performed once. Thus, the distribution of the impurity concentration of each of the contact layer 5 and the emitter layer 4 in the thickness direction has, for example, only one peak.

The activation annealing of the carrier accumulation layer 2, the base layer 3, the emitter layer 4, and the contact layer 5 may be performed individually or collectively.

When the carrier accumulation layer 2 is not provided in the semiconductor device 100, step S24 is not required.

As described above, the method for manufacturing the semiconductor device according to the present preferred embodiment includes: forming the base layer 3 through the fifth ion implantation; forming the emitter layer 4 through the sixth ion implantation; forming the contact layer 5 through the seventh ion implantation; and forming the carrier accumulation layer 2 through the eighth ion implantation. The same mask 30 is used in the fifth ion implantation, the sixth ion implantation, and the eighth ion implantation, and after the fifth ion implantation, the sixth ion implantation, and the eighth ion implantation are performed, the seventh ion implantation is performed using a mask 33 different from the mask 30 used in the fifth ion implantation, the sixth ion implantation, and the eighth ion implantation. As a result, the mask process for the emitter layer 4 can be reduced, and the manufacturing cost can be reduced, compared to the method for manufacturing the semiconductor device of the tenth preferred embodiment.

Although several preferred embodiments have been presented as above, various developments can be made without being limited to the above preferred embodiments. The device structure is applicable to power devices, such as IGBT, metal-oxide-semiconductor field-effect transistor (MOSFET) and RC-IGBT, and is applicable without being limited by a withstand voltage class, a floating zone (FZ) base body/magnetic field applied Czochralski (MCZ) base body/epitaxial base body, and the like.

Note that it is possible to freely combine each of the preferred embodiments and to appropriately modify or omit each of the preferred embodiments.

While the disclosure has been shown and described in detail, the foregoing description is in all aspects illustrative and not restrictive. It is therefore understood that numerous modifications and variations can be devised.

What is claimed is:

1. A semiconductor device comprising
a semiconductor base body having a first main surface and a second main surface that is a main surface opposite to the first main surface,
wherein a transistor is provided in a first element region of the semiconductor base body,
the semiconductor base body includes, in the first element region,
a first semiconductor layer of a first conductivity type,
a second semiconductor layer of a second conductivity type provided closer to the first main surface than the first semiconductor layer,
a third semiconductor layer of a first conductivity type selectively provided on the first main surface side of the second semiconductor layer,
a first electrode electrically connected to the third semiconductor layer, and
a fourth semiconductor layer having a higher impurity concentration of a second conductivity type than an impurity concentration of a second conductivity type of the second semiconductor layer and disposed between the second semiconductor layer and the first electrode,
in the first element region, the semiconductor base body is provided with a plurality of first trenches that penetrate the second semiconductor layer from the first main surface to reach the first semiconductor layer,
the plurality of first trenches each extending in a first direction in plan view,
the plurality of first trenches are arranged in a stripe shape in plan view,
some of the plurality of first trenches or all of the plurality of first trenches are active trenches, each of which penetrates the third semiconductor layer and in each of which a gate electrode is provided in the first trench via a gate insulating film so as to face the second semiconductor layer, the arrangement of the plurality of first trenches in the stripe shape has a portion where the active trenches are adjacent to each other,
in a mesa region sandwiched between the adjacent active trenches among mesa regions that are regions each sandwiched between adjacent trenches, the third semiconductor layer has
regions discretely arranged in the first direction, each having a side in contact with one active trench of the adjacent active trenches in the plan view and not in contact with the other active trench, and for each of the discretely arranged regions having one side in contact with one active trench in the plan view, the fourth semiconductor layer is in contact with all other sides of the discretely arranged region in the plan view, and
regions discretely arranged in the first direction, each having a side in contact with the other active trench in the plan view and not in contact with the one active trench, and for each of the discretely arranged regions having one side in contact with the other active trench in the plan view, the fourth semiconductor layer is in contact with all other sides of the discretely arranged region in the plan view, and
in the mesa region sandwiched between the adjacent active trenches, the fourth semiconductor layer is continuously disposed between the third semiconductor layer on a side in contact with the one active trench and the third semiconductor layer on a side in contact with the other active trench and between the respective regions of the third semiconductor layer discrete in the first direction in plan view such that the fourth semiconductor layer directly contacts the one active trench and directly contacts the other active trench.

2. The semiconductor device according to claim 1, wherein in the mesa region sandwiched between the adjacent active trenches, a width in the first direction where one of the discrete regions of the third semiconductor layer is in contact on a sidewall of the active trench is larger than a width in the first direction between the discrete regions of the third semiconductor layer adjacent in the first direction on the sidewall of the active trench.

3. The semiconductor device according to claim 1, wherein in the mesa region sandwiched between the adjacent active trenches, the fourth semiconductor layer has a continuous region in contact with both of the adjacent active trenches and including a plurality of regions of the third semiconductor layer, discrete in the first direction, with respect to a position in the first direction.

4. The semiconductor device according to claim 1, wherein
some of the plurality of first trenches are dummy trenches each including a dummy gate electrode formed in the trench via a gate insulating film,
the dummy gate electrode is electrically connected to the first electrode, and
the third semiconductor layer is formed so as not to be in contact with a sidewall of the dummy trench.

5. The semiconductor device according to claim 4, wherein in a mesa region sandwiched between the active trench and the dummy trench, the third semiconductor layer has regions discretely arranged in the first direction so as to be in contact with the active trench and not in contact with the dummy trench.

6. The semiconductor device according to claim 4, wherein the arrangement of the plurality of first trenches in the stripe shape has a portion where the dummy trenches are adjacent to each other, and an interlayer insulating film is formed between the semiconductor base body and the first electrode so as to extend from one to the other of the dummy trenches adjacent to each other in the arrangement of the plurality of first trenches in the stripe shape in plan view.

7. The semiconductor device according to claim 6, wherein the interlayer insulating film is formed between the semiconductor base body and the first electrode in entire region between the dummy trenches adjacent to each other in the arrangement of the plurality of first trenches in the stripe shape in plan view.

8. The semiconductor device according to claim 1, wherein the arrangement of the third semiconductor layer in the first direction varies depending on a position in a second direction.

9. The semiconductor device according to claim 8, wherein the arrangement of the third semiconductor layer in the first direction is different between one active trench side and the other active trench side in the mesa region sandwiched between the adjacent active trenches.

10. The semiconductor device according to claim 8, wherein the arrangement of the third semiconductor layer in the first direction is different between both sides of the active trench.

11. The semiconductor device according to claim 1, wherein the regions of the third semiconductor layer that are discrete in the first direction includes a region where a width in a second direction perpendicular to the first direction is broadened in a partial region in the first direction.

12. The semiconductor device according to claim 1, wherein the fourth semiconductor layer is selectively provided on the first main surface side of the second semiconductor layer.

13. The semiconductor device according to claim 1, wherein the first element region includes a fifth semiconductor layer of a second conductivity type closer to the second main surface than the first semiconductor layer, and a second electrode electrically connected to the fifth semiconductor layer, a diode region different from the first element region is provided in the semiconductor base body such that the diode region is adjacent to the first element region, and the diode region includes the first semiconductor layer, a sixth semiconductor layer of a second conductivity type disposed closer to the first main surface than the first semiconductor layer, a plurality of third trenches penetrating the sixth semiconductor layer from the first main surface to reach the first semiconductor layer, a diode trench electrode disposed in the third trench via a gate insulating film, a seventh semiconductor layer of a first conductivity type disposed closer to the second main surface than the first semiconductor layer, and the second electrode electrically connected to the seventh semiconductor layer, and the diode trench electrode is electrically connected to the first electrode.

14. The semiconductor device according to claim 13, wherein a boundary region is provided between the first element region and the diode region, and the boundary region includes the first semiconductor layer, the fifth semiconductor layer disposed closer to the second main surface than the first semiconductor layer, and the sixth semiconductor layer disposed closer to the first main surface than the first semiconductor layer.

15. The semiconductor device according to claim 1, wherein a distribution of an impurity concentration of each of the fourth semiconductor layer and the third semiconductor layer in a thickness direction has only one peak.

16. The semiconductor device according to claim 1, wherein in the semiconductor base body, an eighth semiconductor layer having a higher impurity concentration of a first conductivity type than an impurity concentration of a first conductivity type of the first semiconductor layer is provided between the first semiconductor layer and the second semiconductor layer in the first element region.

17. The semiconductor device according to claim 16, wherein the gate electrode and a shield electrode are disposed in the active trench via the gate insulating film, the shield electrode is electrically connected to the first electrode, a center of the shield electrode in a depth direction is located closer to the second main surface than a center of the gate electrode in the depth direction, and an end of the gate electrode closer to the second main surface is included in a range in which the eighth semiconductor layer is provided in the depth direction.

* * * * *